(12) United States Patent
Ma et al.

(10) Patent No.: US 6,621,137 B1
(45) Date of Patent: Sep. 16, 2003

(54) MEMS DEVICE INTEGRATED CHIP PACKAGE, AND METHOD OF MAKING SAME

(75) Inventors: Qing Ma, San Jose, CA (US); Peng Cheng, Campbell, CA (US); Valluri Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 321 days.

(21) Appl. No.: 09/687,907

(22) Filed: Oct. 12, 2000

(51) Int. Cl.[7] .............................................. H01L 29/00
(52) U.S. Cl. ..................... 257/528; 257/532; 257/777
(58) Field of Search .................. 257/532, 303, 257/306, 777, 783, 307, 308, 782, 528

(56) References Cited

U.S. PATENT DOCUMENTS 5,309,014 A * 5/1994 Wilson ...................... 257/584
6,342,724 B1 * 1/2002 Wark et al. ................ 257/532

* cited by examiner

Primary Examiner—Roy Potter
(74) Attorney, Agent, or Firm—Blakely, Sokoloff, Taylor & Zafman LLP

(57) ABSTRACT

The present invention relates to a chip package that includes a semiconductor device and at least one micro electromechanical structure (MEMS) such that the semiconductor device and the MEMS form an integrated package. One embodiment of the present invention includes a semiconductor device, a first MEMS device disposed in a conveyance such as a film, and a second MEMS device disposed upon the semiconductor device through a via in the conveyance. The present invention also relates to a process of forming a chip package that includes providing a conveyance such as a tape automated bonding (TAB) structure that may bold at least one MEMS device. The method is further carried out by disposing the conveyance over the active surface of the device in a manner that causes the at least one MEMS to communicate electrically to the active surface. Where appropriate, a sealing structure such as a solder ring may be used to protect the MEMS.

18 Claims, 23 Drawing Sheets

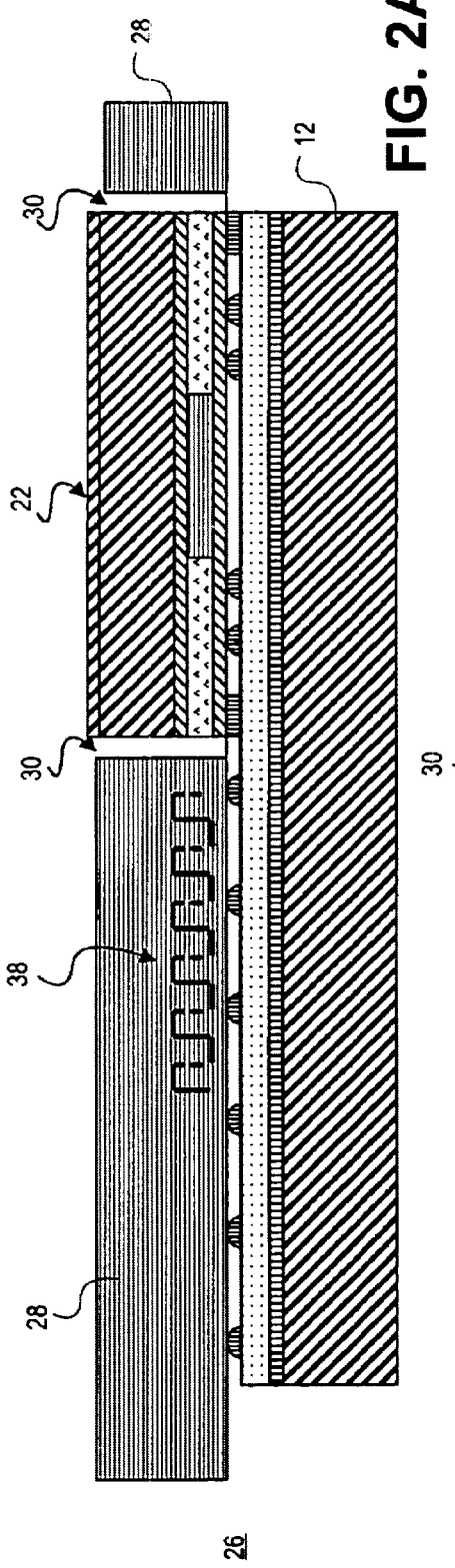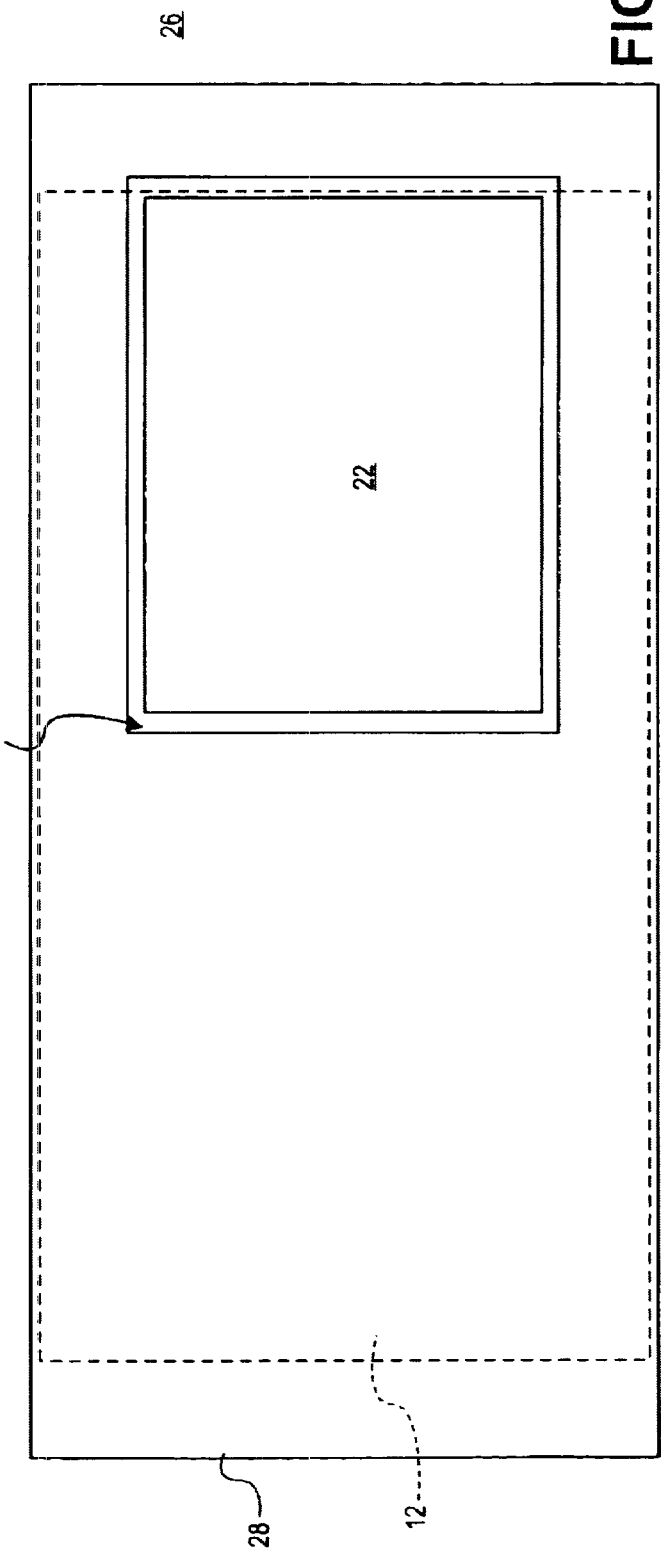

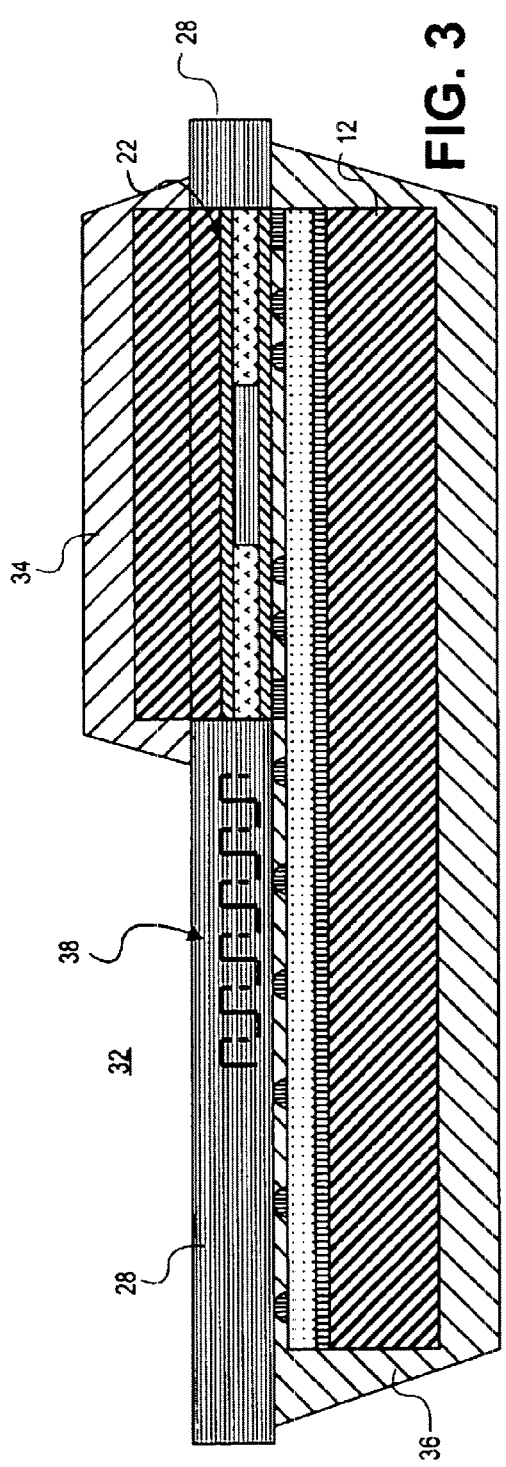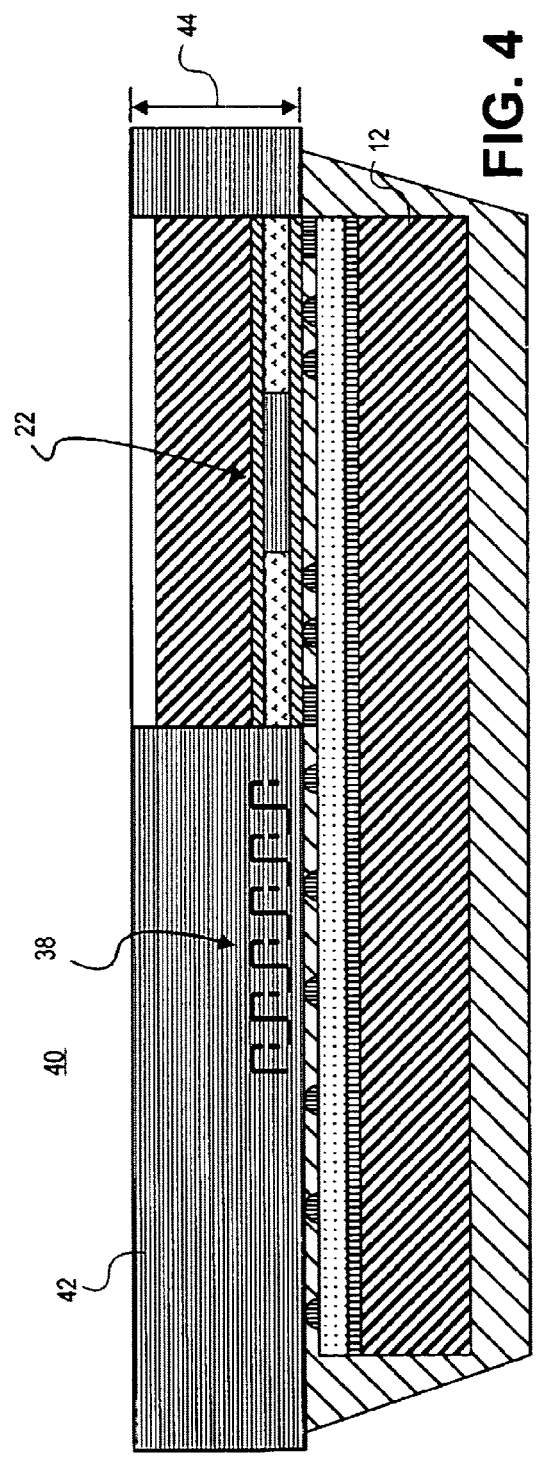

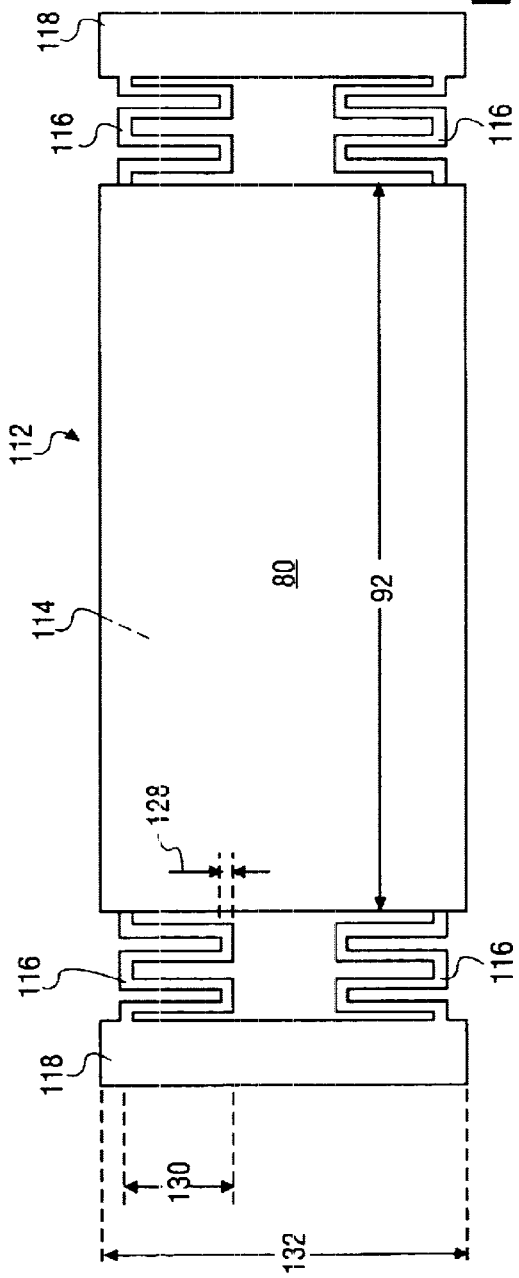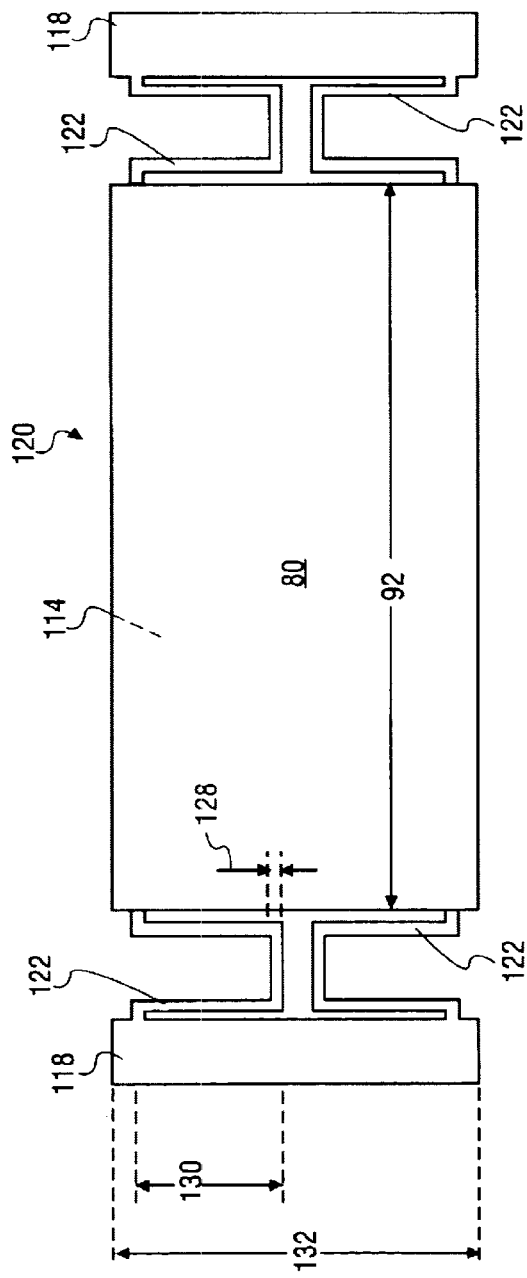

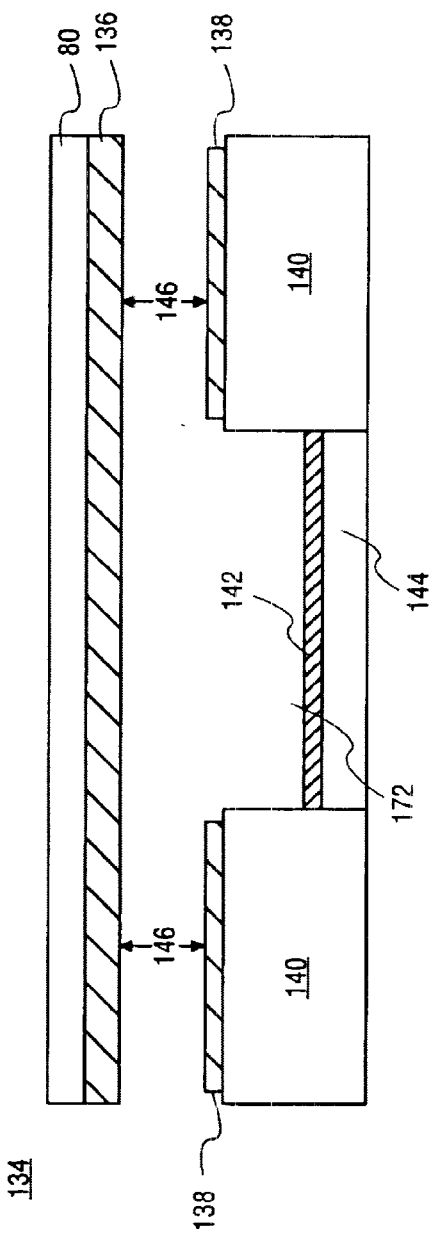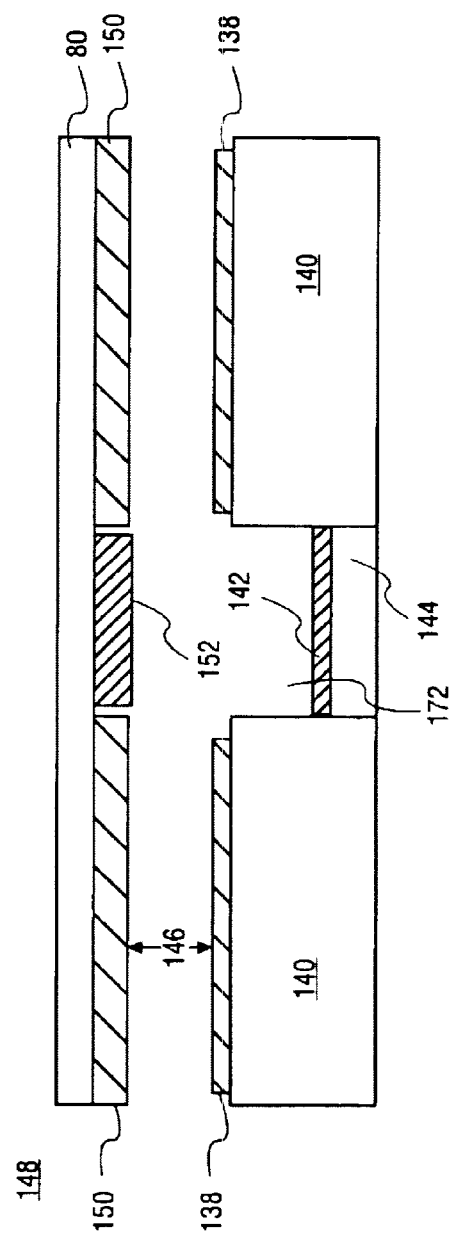

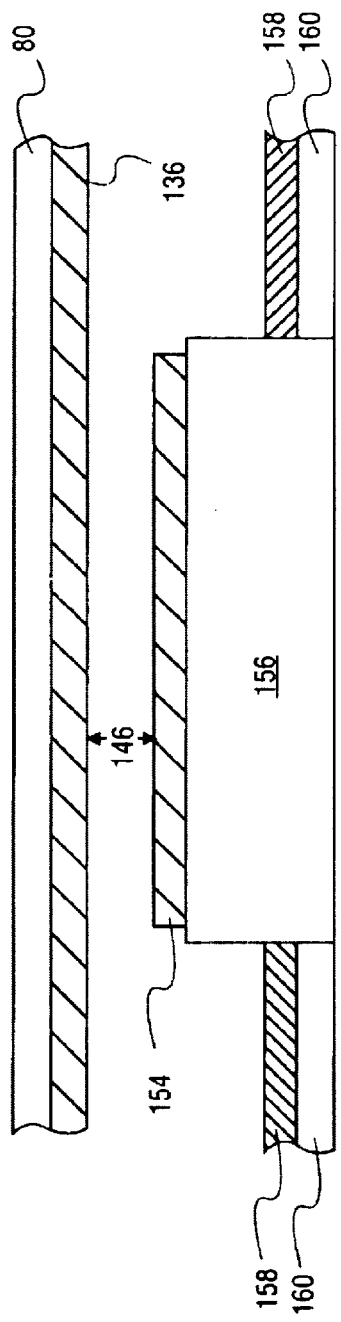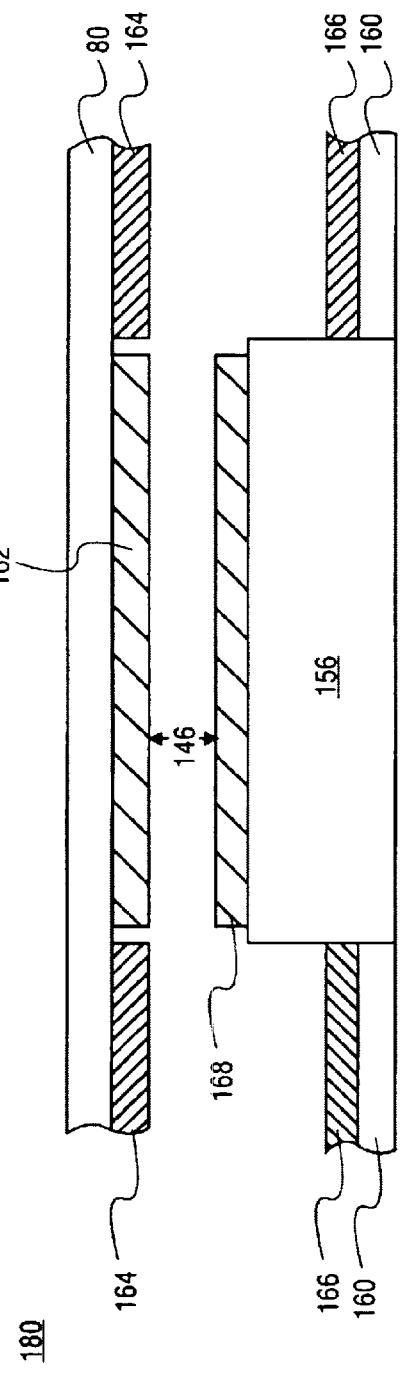

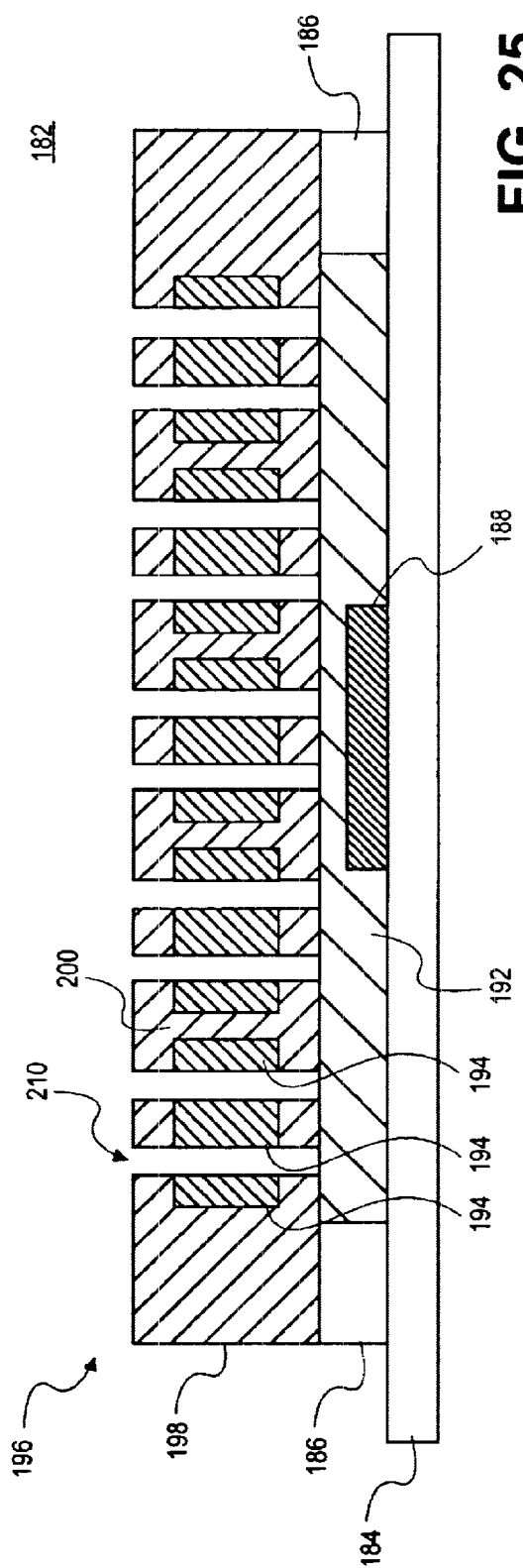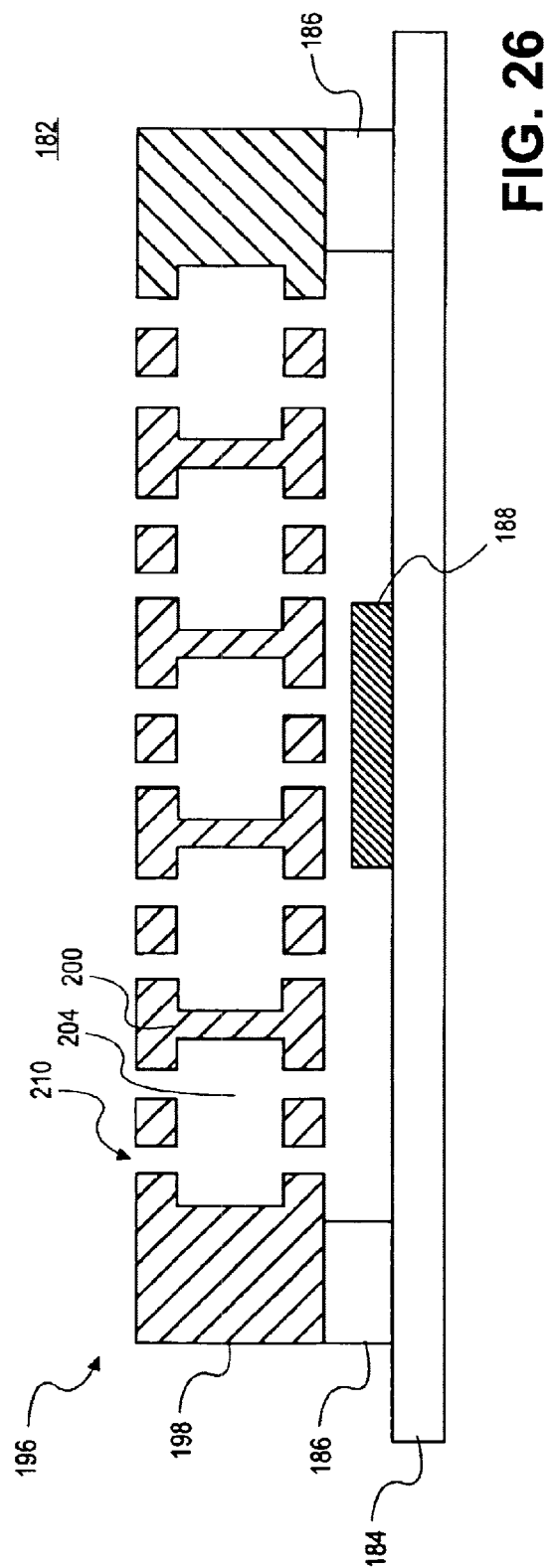

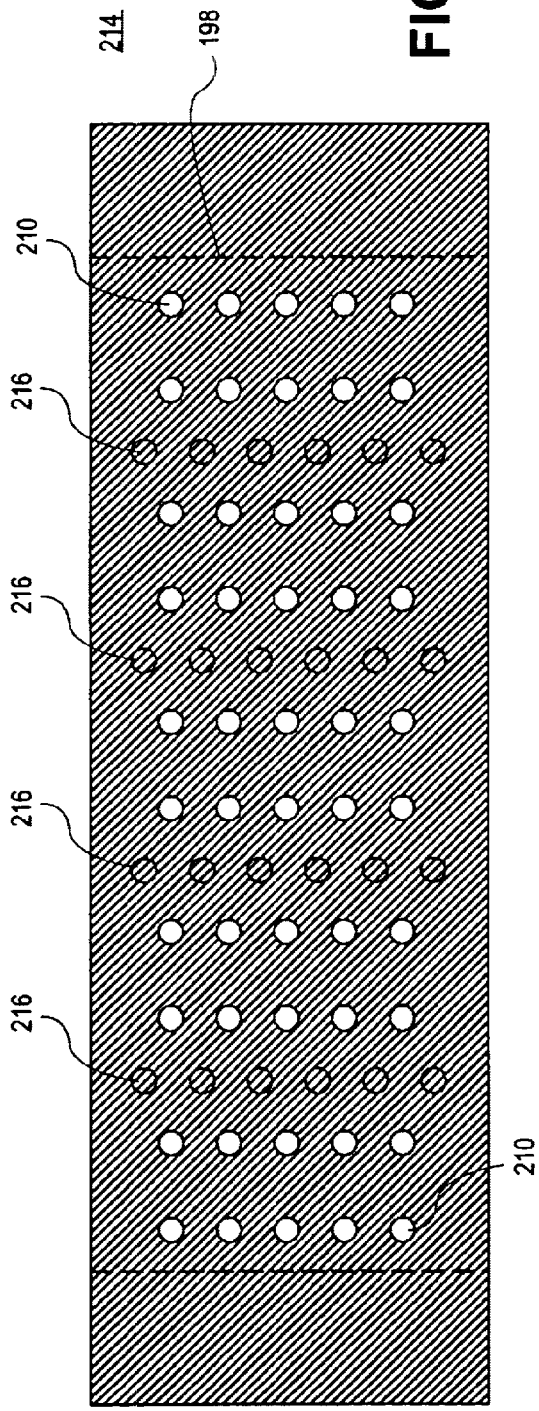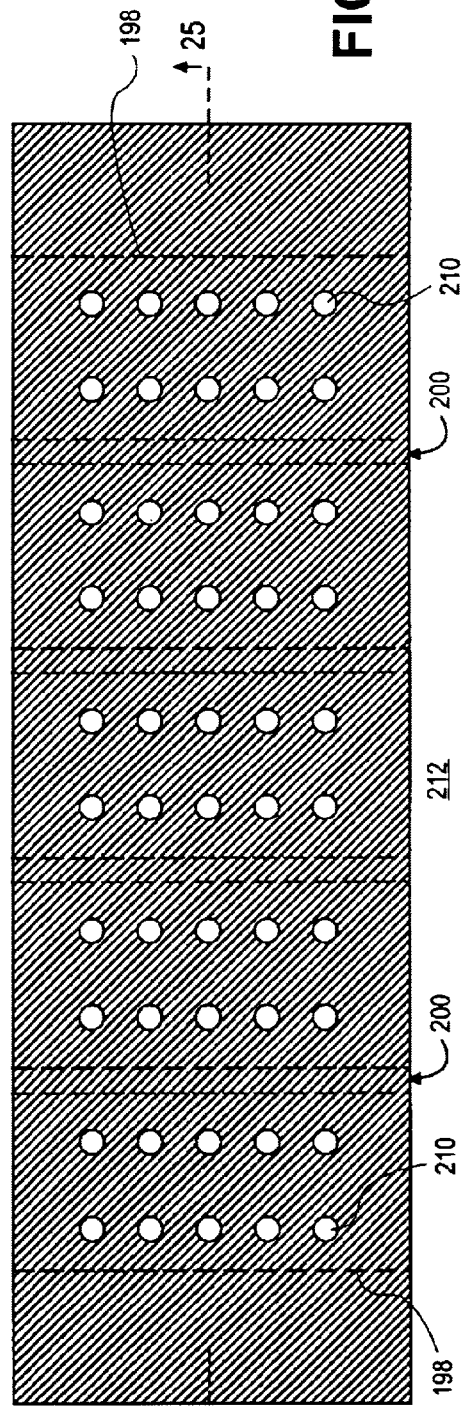

MEMS DEVICE INTEGRATED CHIP PACKAGE, AND METHOD OF MAKING SAME

BACKGROUND OF THE INVENTION

1. Field of the Invention

The present invention relates generally to integrated circuit chip (IC) packaging. More particularly, the present invention relates to the packaging devices with an integrated circuit chip package. In particular, the present invention relates to integrated packaging of a microelectronic device with devices such as switches, capacitors, filters, resonators, inductors, and power supplies.

2. Description of Related Art

One of the difficulties of integrated circuit packaging is that selected large, usually passive devices that may be placed on silicon with an IC, have structures that are not compatible with the integrated fabrication scheme of the traditional active components such as field effect devices and metallization wiring layouts. Among these usually passive devices are included, not by way of limitation, switches, capacitors, resonators, inductors, and power supplies. For example, on an active surface of a device that requires quality factor inductors, it becomes difficult integrate into the fabrication scheme a large-enough conductive structure to have the high inductance (Q) that may be required. Similarly, where a large surface area is needed for a specific capacitor, the real estate cost to place it on the semiconductor device silicon is uneconomical.

Another problem relates to prior art on-chip variable capacitors. These capacitors are based on varactor diode technology that have a tuning range of less than about 25%. The varactor diode technology also has a low pull-in effect. Additionally, prior art membrane capacitors have a capacitance tunable range that is limited due to the voltage exceeding the critical voltage (Vc) thereof. At Vc, the membrane collapses and the capacitor shorts out. Additionally, due to the suspension nature of the prior art capacitors, the center portion of the flexible membrane draws closer to the fixed electrode than the edge portions. This phenomenon creates a greater local capacitance at the center of the flexible membrane than at the edge portions of the flexible membrane where it is anchored. Between capacitors, it is difficult to control capacitance change in any predictable way such as a linear or even a nonlinear functional correlation between the amount of applied direct current (DC). voltage and the resulting capacitance. Where the edge portions of the flexible membrane occupies a substantial capacitance surface area in relation to the center portion, it becomes difficult to achieve an appreciable range of tunable capacitance.

Another need that has arisen is for smaller- and higher-frequency resonators for both signal filtering and signal generating purposes. The prior state of the art used discrete crystals or devices that generate a surface acoustical wave (SAW) for their desired functions. As miniaturization of devices progresses, the discrete crystals and SAW generating devices do not shrink at the same rate. Therefore discrete passive devices ultimately limit how small an RF system can be.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. In the drawings, like structures will be provided with like reference designations. In order to show the structures of the present invention most clearly, the drawings included herein are diagrammatic representations of integrated circuit structures. Thus, the actual appearance of the fabricated structures, for example in a photomicrograph, may appear different while still incorporating the essential structures of the present invention. Moreover, the drawings show only the structures necessary to understand the present invention. Additional structures known in the art have not been included to maintain the clarity of the drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which:

FIG. 1b is a top plan view of the integrated MEMS package depicted in FIG. 1a;

FIG. 2a is an elevational cross-section schematic view of an inventive integrated MEMS package after further processing;

FIG. 2b is a top plan view of the integrated MEMS package depicted in FIG. 2a;

FIG. 3 is an elevational cross-section schematic view of an inventive integrated MEMS package;

FIG. 4 is an elevational cross-section schematic view of an inventive integrated MEMS package;

FIG. 13 is a top view of an alternative embodiment of the variable capacitor depicted in FIG. 9;

FIG. 14 is a top view of an alternative embodiment of the variable capacitor depicted in FIG. 9;

FIG. 16 is an elevational cross-section view of another embodiment of the variable capacitor;

FIG. 17 is an elevational cross-section view of an alternative embodiment of the variable capacitor depicted in FIG. 16;

FIG. 18 is an elevational cross-section view of another embodiment of the variable capacitor;

FIG. 19 is an elevational cross-section view of an alternative embodiment of the variable capacitor depicted in FIG. 18;

FIG. 25 illustrates further alternative processing of the resonator beam structure taken along the section line 25—25 in FIG. 27, wherein etch through-holes are formed to facilitate removal of temporary filler material;

FIG. 26 is an elevational cross-section view of the resonator beam structure depicted in FIG. 25, wherein the temporary filler material has been substantially removed;

FIG. 27 is a top view of the resonator beam structure wherein etch through holes are depicted;

FIG. 28 is a top view of an alternative embodiment of the resonator beam structure depicted in FIG. 24, wherein etch through-holes are depicted, and wherein the mass of the resonator beam structure is reduced by the placement of internal posts in lieu of internal walls;

DETAILED DESCRIPTION OF THE INVENTION

The present invention relates to a chip package that places micro electromechanical structure (MEMS) devices in a structure that is separate from the integrated circuit (IC) chip. The chip package may include a semiconductor device in one piece of silicon, and at least one MEMS in a separate structure such as a separate piece of silicon or like, or a printed circuit board or the like. The semiconductor device and the at least one MEMS comprise an integrated package.

Figure 1A:
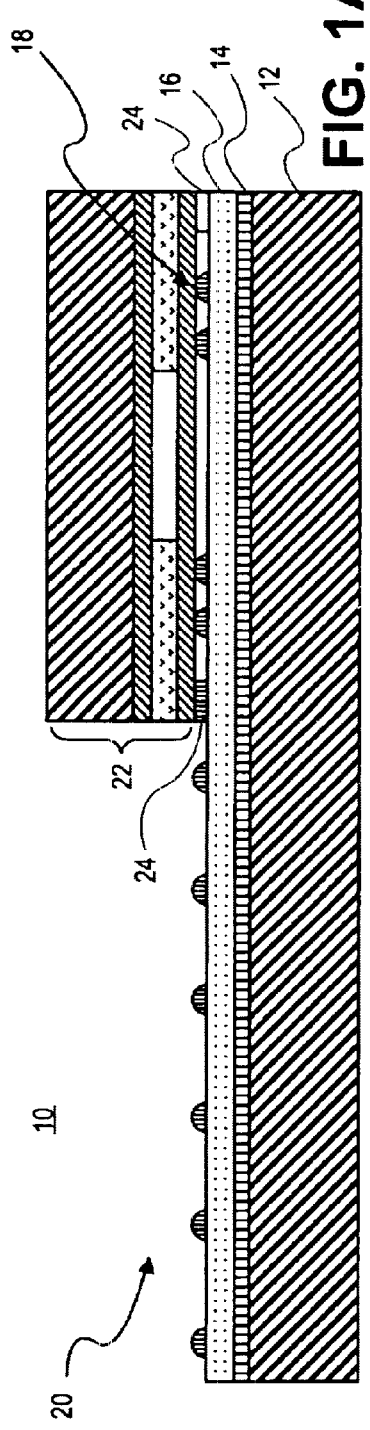
FIG. 1a is an elevational cross-section schematic view of an inventive integrated micro electromechanical structure (MEMS) package.

FIG. 1a is an elevational side view of a MEMS package 10 during fabrication. MEMS package 10 includes a semiconductor device 12 with an active surface 14 and dielectric layer 16 such as an interlayer dielectric layer (ILD). Upon dielectric layer 16 is disposed a first electrical contact array 18 over active surface 14 and a second electrical contact array 20 also over active surface 14. Above active surface 14 is disposed a first MEMS 22. First MEMS 22 may be by way of non-limiting example, selected from a capacitor, a switch, an inductor, a power supply, an oscillator, a resonator, and a filter. In one embodiment, first MEMS 22 is a variable capacitor that is fabricated according to an inventive method set forth below. First MEMS 22 is disposed in a first structure that may be selected from monocrystalline silicon, polysilicon, silicon on oxide, silicon on insulator, and the like.

Figure 1B:
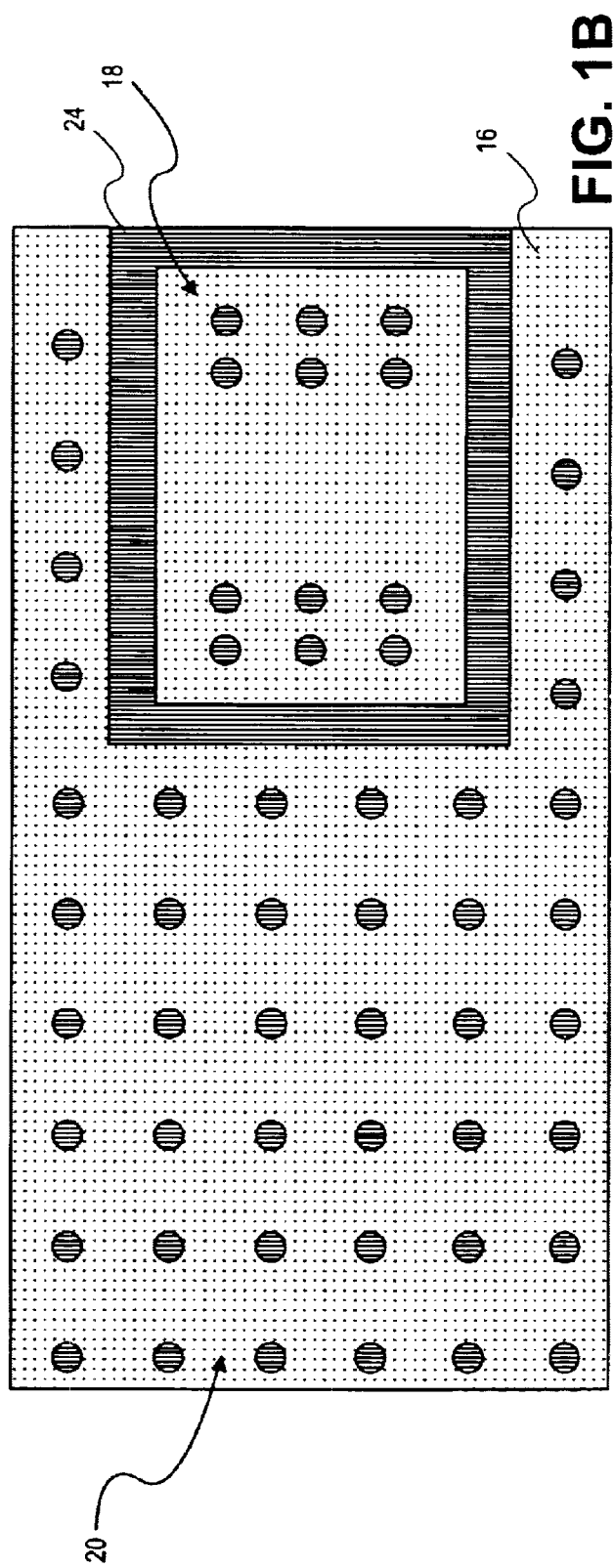

In FIG. 1b, a top plan view of MEMS package 10 is illustrated. First electrical contact array 18 is depicted as being surrounded by a sealing structure 24. Sealing structure 24 may be by way of non-limiting example a solder ring. Sealing structure 24 has a functionality of hermetically sealing first MEMS 22 because it is in a flip-chip configuration with semiconductor device 12.

FIG. 2a is an elevational cross section schematic view of a MEMS package 26 that illustrates additional structure. A conveyance 28 is disposed over semiconductor device 12 in such a manner that first MEMS 22 is accommodated thereby. One example of an accommodation of first MEMS 22, by conveyance 28 is a via 30 that has an equal or larger footprint over semiconductor device 12 as first MEMS 22 as illustrated in FIG. 2b.

Conveyance 28 may be a tape such as that used in tape automated bonding (TAB) and the like. Conveyance 28 may be a flexible substrate and the like that may include a single layer or multiple layers that may have electrical traces therein. Optionally, embedded within conveyance 28 is an embedded MEMS 38, illustrated in FIG. 2 as an embedded helical inductor hereinafter referred to as an inductor MEMS 38. It is understood that other MEMS devices may be embedded in conveyance 26 such as an oscillator including a resonator, a filter, and the like. Alternatively, the MEMS may be a power supply. Alternatively, the MEMS may be a switch, a fixed capacitor, a variable capacitor and the like. Alternatively, the MEMS may be a spiral inductor and the like.

FIG. 3 is an elevational side schematic view of a MEMS package 32 that illustrates additional structure. A structure of a first encapsulation material 34 is disposed over first MEMS 22 and over a portion of conveyance 28. Optionally, a structure of a second encapsulation material 36 may be disposed below semiconductor device 12 and partially in contact with conveyance 28.

FIG. 4 is an elevation side schematic view of another embodiment of a MEMS package 40. In FIG. 4, a conveyance 42 is depicted as having a profile height 44 that substantially obscures first MEMS 22 from view when observed from the side. Optionally, conveyance 42 may be a composite structure such as a tape or board that has been overmolded with encapsulation material.

Figure 5:
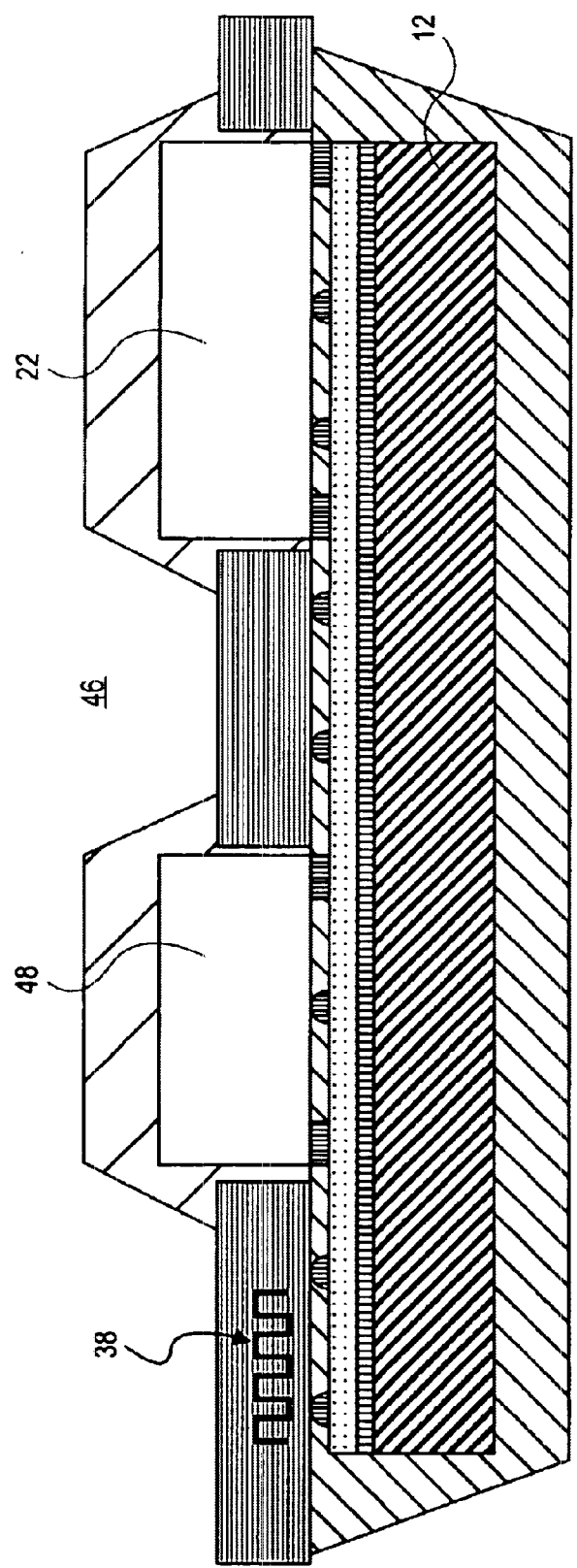
FIG. 5 is an elevational cross-section schematic view of an inventive integrated MEMS package.

FIG. 5 illustrates another embodiment with a MEMS package 46 which includes a third MEMS 48 that is disposed in a third structure, and that is spaced apart from first MEMS 22. In this embodiment, third MEMS 48 may be the same type of device as first MEMS 22, or it may be different type of device. The presence of third MEMS 48 may arise where fabrication constraints require substantially different processing to make different structures. For example, where either one or both of first MEMS 22 and third MEMS 48 is an oscillator, they may be a bridge oscillator, a cantilever oscillator, and may be manufactured as set forth below. Third MEMS 48 is disposed in a third structure that may be selected from monocrystalline silicon, polysilicon, silicon on oxide, silicon on sapphire, and the like. Either or both of first MEMS 22 or third MEMS 48 may be referred to as a detached MEMS wherein they may be accommodated onto semiconductor device 12 or by conveyance 28 on semiconductor device 12 such as by pick and place techniques into respective vias of a conveyance.

Figure 6:
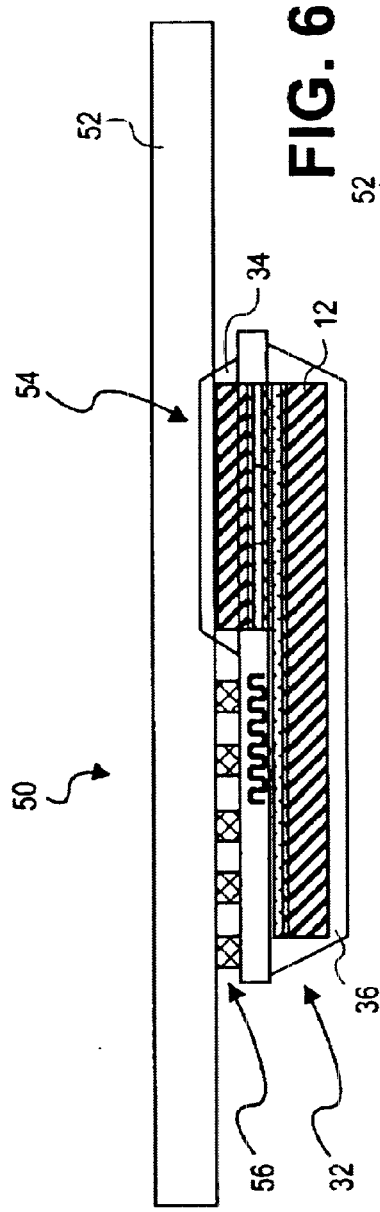
FIG. 6 is an elevational cross-section schematic view of an inventive integrated MEMS package that is mounted upon a substrate.

FIG. 6 is an elevational side schematic view of another embodiment of the present invention wherein MEMS package 32 depicted in FIG. 3 has been mounted on a substrate 52 to form a MEMS package 50. Substrate 52 may be a printed circuit board (PCB), a printed wiring board (PWB), or the like. Where MEMS package 32 may have a profile that includes a prominent portion such as first encapsulation material 34 or other parts, a recess 54 may be provided in substrate 52 to accommodate it. Electrical communication, or otherwise, is made between substrate 52 and MEMS package 32 through an electrical contact array 56 such as a ball array.

Figure 7:
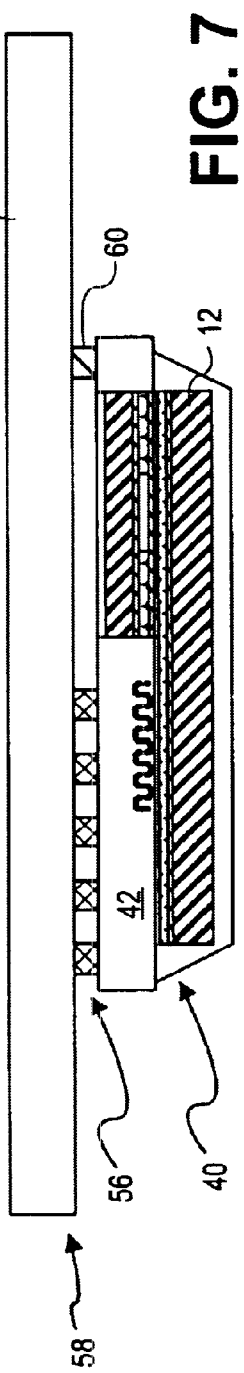
FIG. 7 is an elevational cross-section schematic view of an inventive integrated MEMS package that is mounted upon a substrate.

FIG. 7 is an elevational side schematic view of another embodiment of the present invention wherein MEMS package 40 depicted in FIG. 4 has been mounted on a substrate 52 to form a mounted MEMS package 58. Substrate 52 may be a PCB, a PWB, or the like. Where MEMS package 40 may have an electrical an electrical contact array 56 that is substantially to one side of MEMS package 40, a dummy electrical contact 60 or the like may be provided for structural stability of substrate 52 and MEMS package 40.

Figure 8:
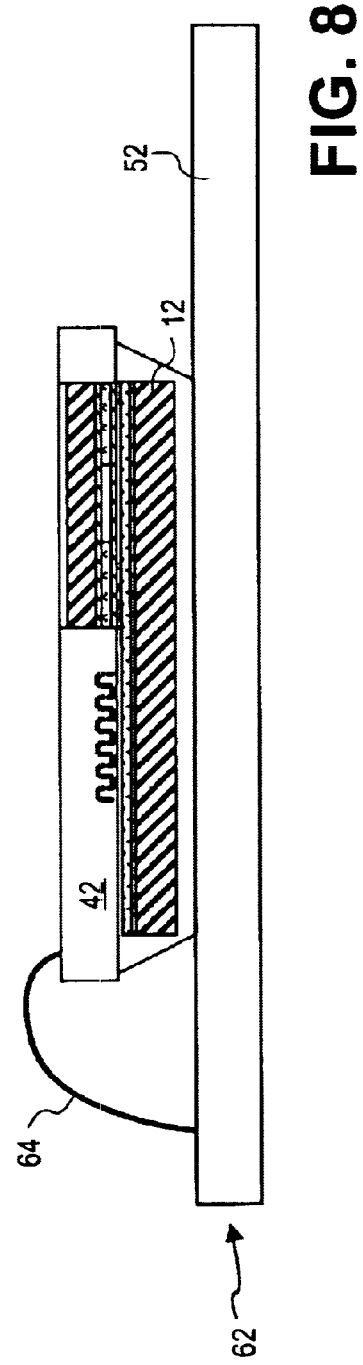
FIG. 8 is an elevational cross-section schematic view of an inventive integrated MEMS package that is wire bonded and mounted upon a substrate.

FIG. 8 is an elevational side schematic view of another embodiment of the present invention wherein MEMS package 40 depicted in FIG. 4 has been mounted on a substrate 52 in a wire-bond configuration to form a wire-bond mounted MEMS package 62. Substrate 52 may be a PCB, a PWB, or the like. Where MEMS package 40 is to be wire bonded, bond wires 64 may accomplish electrical communication between MEMS package 40 and substrate 52.

Various MEMS devices are fabricated according to the present invention. Where first MEMS 22 is a capacitor, it may be configured to be variable. In the instant invention, the prevention of collapse of the capacitor is accomplished. Thereby, the tunable range is increased over the prior art by a factor of at least two, and preferably by a factor of at least four and higher.

Figure 9:
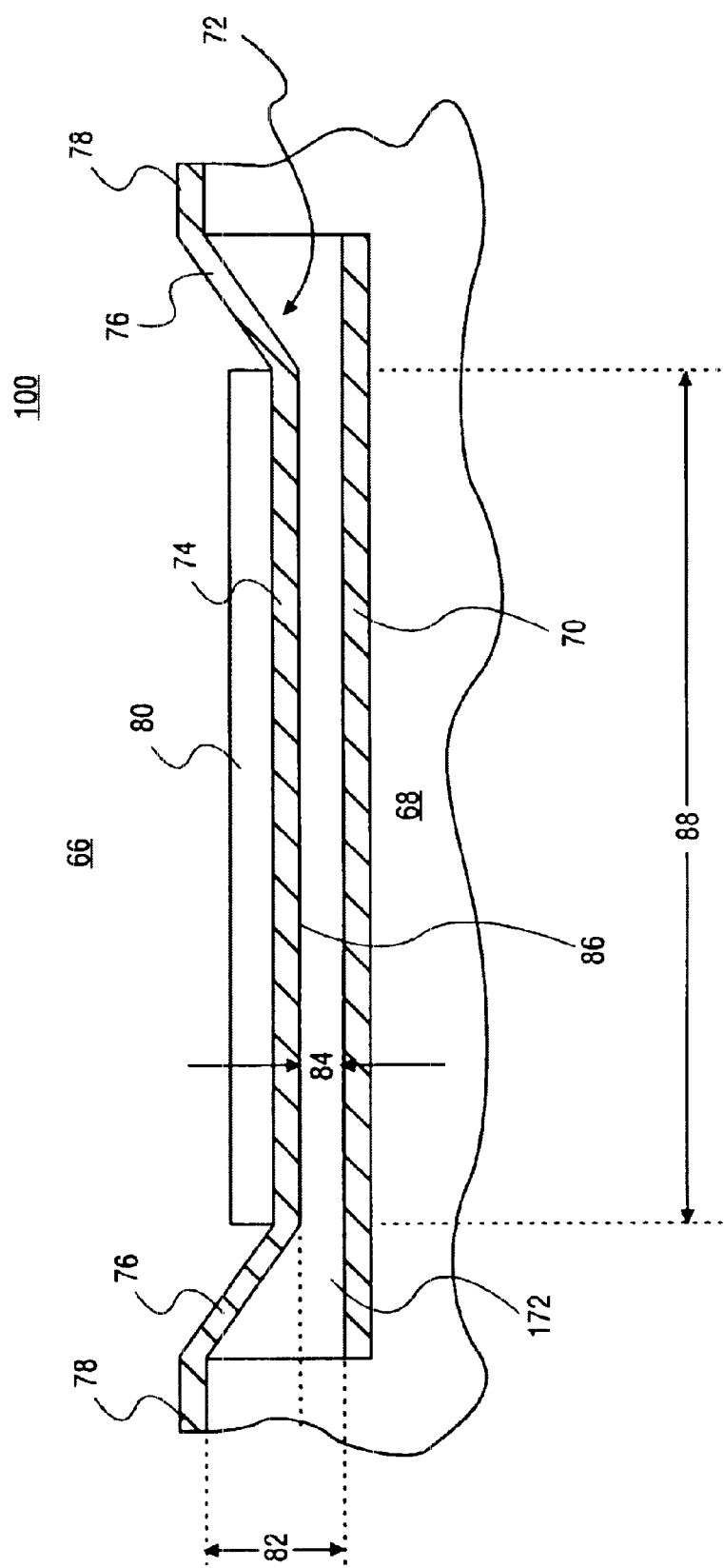
FIG. 9 is an elevational cross-section view of a variable capacitor according to the present invention.

FIG. 9 is an elevational cross-section view of the inventive variable capacitor that is designated by the reference numeral 66. FIG. 9 illustrates a substrate 68 in which a fixed charge plate 70 is disposed. A movable charge plate 72 is disposed above fixed charge plate 70. Movable charge plate 72 may be characterized by a planar portion 74, a suspension portion 76, and a terminal portion 78. Affixed to planar portion 74 of movable charge plate 72 is a stiffener 80. Stiffener 80 may occupy the same footprint as planar portion 74 of movable charge plate 72.

A first separation distance 82 is observed as the original separation distance between fixed charge plate 70 and planar portion 74 before an actuation force is applied. Similarly, a second separation distance 84 is observed between planar portion 74 and fixed charge plate 70 as the tunable capacitor separation distance at a given applied actuation force.

Stiffener 80 may be made of any material that causes planar portion 74 of movable charge plate 72 to resist bending. Preferably, stiffener 80 is made of silicon nitride, $Si_xN_y$, where x and y have values that make up both stoichiometric and solid solution combinations. Stiffener 80 may also be made of oxides such as silica, titania, alumina, ceria, thoria, and other oxides that make up both stoichiometric and solid solution combinations. Additionally, stiffener 80 may be made of any material, preferably dielectric, that allows the inventive structure to achieve a tunable range greater than about 30%, preferably greater than about 50%, and more preferably greater than about 100%.

Figure 10:
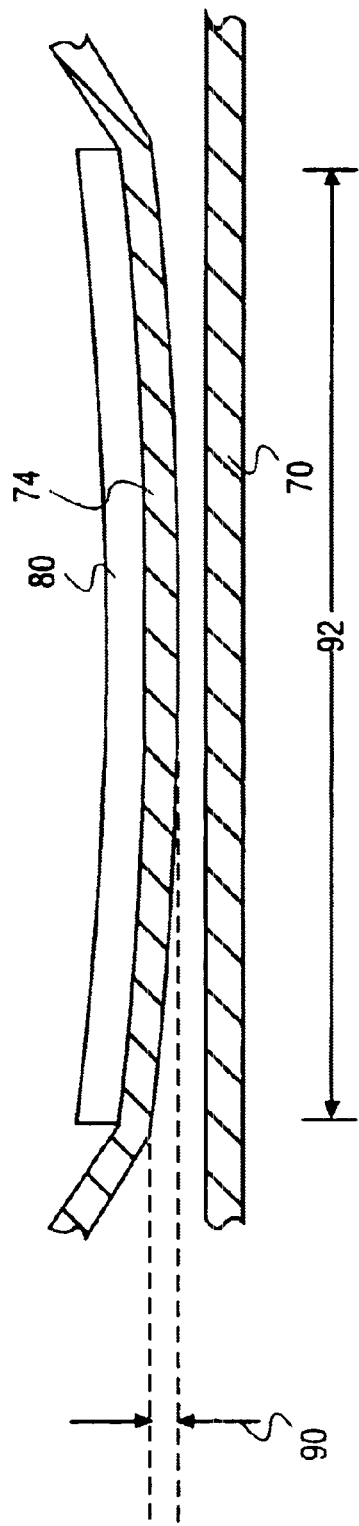
FIG. 10 is an exaggerated elevational cross-section view of the variable capacitor to illustrate relative warping of a MEMS device.

Second separation distance 84 is observed to be substantially constant. By "substantially constant," it is meant that warping of planar portion 74 of movable charge plate 72 is minimized. Relative warping is defined as a relative measure of deflection of any point along the charge surface 86 of planar portion 74 in vertical relation to any other point thereon, divided by the length 88 of planar portion 74. FIG. 10 is an exaggerated detail illustration of relative warping wherein the deflection difference 90, can be relatively quantified by dividing by the length 92. Relative warping in the present invention may be in a range from about 30% to about 0.1%, preferably from about 10% to about 0.5% and most preferably from about 2% to about 1%.

Referring again to FIG. 9, first separation distance 82 is the measurement from terminal portion 78 of movable charge plate 72 to down to fixed charge plate 70. Suspension portion 76 of movable charge plate 72 is separated from fixed charge plate 70 over a variable distance that is at a maximum at first separation distance 82 and at a minimum at second separation distance 84. Consequently, removing material in this portion preferably reduces capacitance for suspension portion 76.

Figure 11:
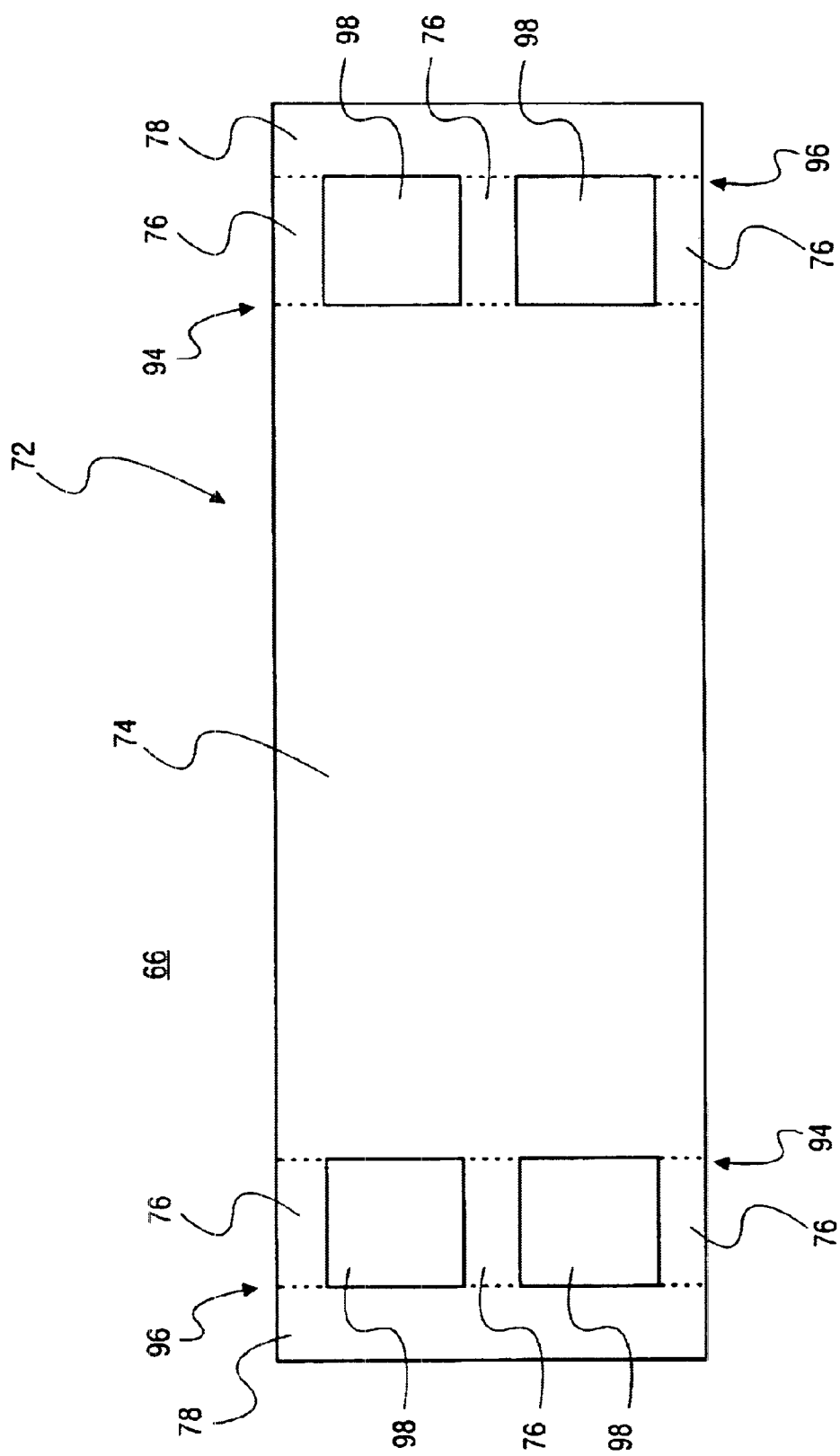
FIG. 11 is a top cut-away view of the variable capacitor depicted in FIG. 9.

FIG. 11 is a top view of variable capacitor 66 that further illustrates the present invention. Stiffener 80 has been removed to further illustrate movable charge plate 72. Movable charge plate 72 is seen as comprising planar portion 74 and suspension portion 76 that meet an angle at a bend depicted by the dashed line 94, and terminal portion 78. Terminal portion 78 and suspension portion 76 also meet at an angle at a bend depicted by the dashed line 96.

FIG. 11 illustrates that suspension portion 76 may contain through holes 98 to form a broken surface suspension of planar portion 74. The broken surface of suspension portion 76 of movable charge plate 72 reduces capacitance surface area for that section of movable charge plate 72 by reducing the amount of charge surface area that is present at the variable first separation distance 82. Thereby the broken surface of suspension portion 76 allows for better control of the variable capacitor quality of the present invention. Additionally, because there is less material that must bend in suspension portion 76 when it has a broken surface suspension, movable charge plate 72 is more pliable and therefore more easily tunable. It is understood that suspension portion 76 may also be solid. Where suspension portion 76 has a broken surface, fixed charge plate 70 has a first surface area and movable charge plate 72 has a second surface area that is smaller than the first surface area.

In a preferred embodiment, the capacitor according to the present invention has a movable charge plate that is divided into a solid surface charge plate portion and a broken surface suspension.

Figure 12:
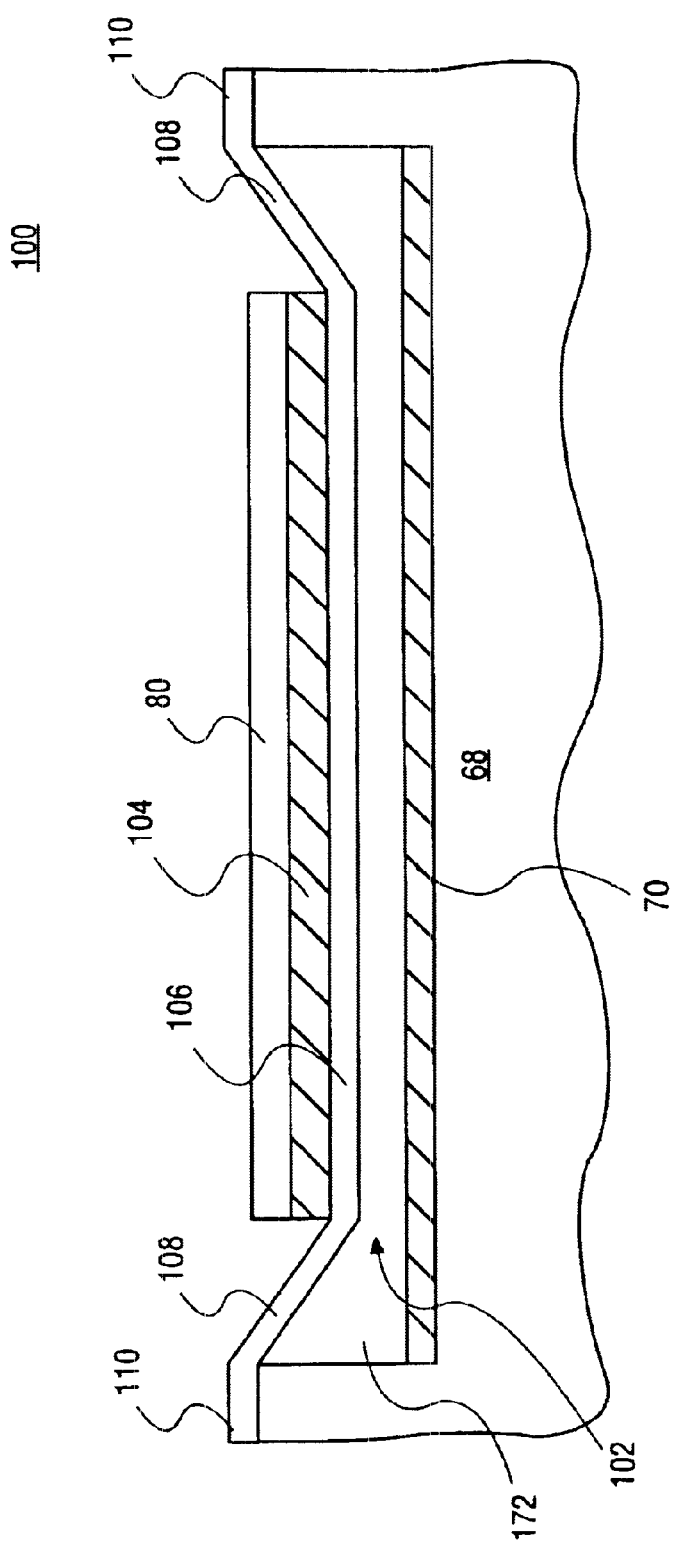
FIG. 12 is an elevational cross-section view of another embodiment of the variable capacitor.

FIG. 12 is an elevational cross-section view of another variable capacitor 100 that illustrates another embodiment of the present invention. FIG. 12 illustrates a flexible dielectric material 102 that has a movable charge plate 104 disposed thereon and that is suspended above a fixed charge plate 70. It is noted that movable charge plate 104 cannot make electrical contact with fixed charge plate 70 because flexible dielectric material 102 is interposed therebetween.

In this embodiment, flexible dielectric material 102 is divided into a planar subsection 106, a suspension subsection 420, and a terminal subsection 440. A stiffener 80 is disposed upon flexible dielectric material 102. Stiffener 80 has a footprint that may be substantially the same as movable charge plate 104 as well as planar subsection 106. Movable charge plate 104 is interposed between stiffener 80 and planar subsection 106. Although stiffener 80 is illustrated as entirely cloaking movable charge plate 104 from a top-down view in FIG. 12, it is understood that stiffener 80 may have a footprint that is larger, the same as, or smaller than movable charge plate 104. Where stiffener 80 is larger than movable charge plate 104, it may be larger by a factor range from about 1.01 to about 2, preferably from about 1.1 to about 1.5.

In the process of forming at least one through hole 98 (not pictured in FIG. 12) in the flexible dielectric material 102 below the movable charge plate, at least one through hole 98 has an area, relative to the total area of flexible dielectric material 102, in a range from about 1% to about 50%, preferably from about 10% to about 40%.

FIG. 13 is another embodiment of the present invention. In this embodiment, a stiffener 80 is superimposed over a movable charge plate 112 (not visible). In this embodiment, stiffener 80 obscures the planar portion 114 of movable charge plate 112. In this embodiment, the suspension portion 116 of movable charge plate 112 forms a spring in the shape of an undulating suspension between planar portion 114 and the terminal portion 118 of movable charge plate 114. By this embodiment, greater flexibility may be achieved for the actuation of planar portion 114 of movable charge plate 112.

Figure 15:
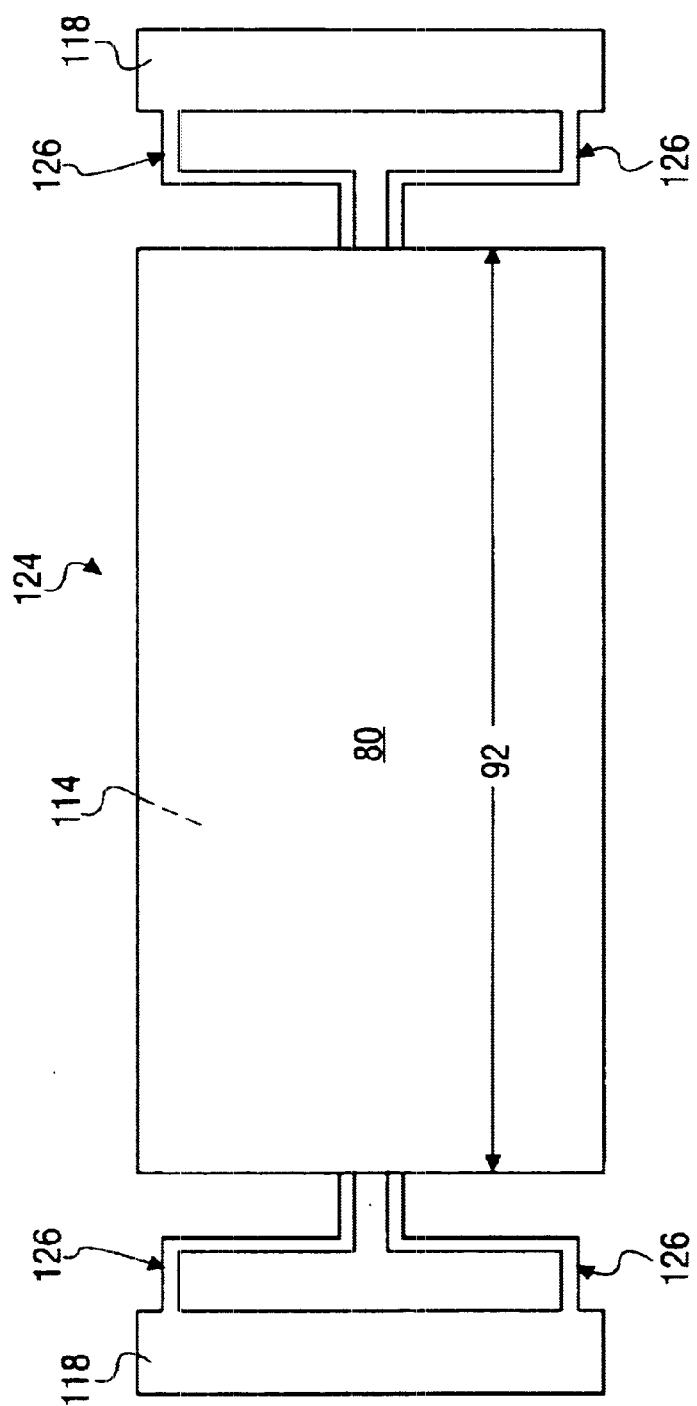
FIG. 15 is a top view of an alternative embodiment of the variable capacitor depicted in FIG. 9.

FIG. 13 illustrates suspension portion 116 with "W" and "M" shapes. Although these shapes are one preferred embodiment, simpler or more complex shapes may be achieved. One example of a simpler shape is illustrated in FIG. 14. In FIG. 14, a movable charge plate 120 with a suspension portion 122 with both "U" shaped and an inverted "U." shaped undulating connections between planar portion 114 and the terminal portion 118 of movable charge plate 120. Another example of a simpler shape is illustrated in FIG. 15. In FIG. 15, a movable charge plate 124 includes a suspension portion 126 that has both "S" and mirror-image "S" shapes that undulate between planar portion 114 and the terminal portion 118 of movable charge plate 124.

Although the undulating suspensions 116, 122, and 126, respectively depicted in FIGS. 13, 14, and 15 are presented as portions of movable charge plates 112, 120, and 124, respectively, it is understood that the undulating suspensions 116, 122, and 126, may also be integral portions of flexible dielectric materials. The integral portions of flexible dielectric materials may be for structures depicted in FIG. 12.

In an alternative embodiment, the undulating configuration that constitutes the suspension portion of the flexible dielectric, may be a continuous undulating structure that extends across the planar portion of the movable charge plate to create a multiple channel open configuration. Accordingly, where FIG. 12 may illustrate a continuous undulating structure, it may begin at one terminal portion 110, continue as one suspension portion 108, continue as planar portion 106, and finish as the other suspension portion 108 and terminal portion 110, respectively.

Different degrees of flexibility are achieved by the particular material used, whether charge plate material or flexible dielectric material, and by the dimensions of the undulating structures. For example, suspension portion 116 of movable charge plate 112 has a thickness 128 and amplitude 130 that may be related to the length 92 and/or the width 132 of movable charge plate 112. Similarly, the suspension portion 122 of movable charge plate 120 has a thickness 128 and amplitude 130 that may be related to the length 92 and/or the width 132 of movable charge plate 120.

FIG. 16 illustrates another embodiment of the present invention in which the functions of capacitance and electrostatic actuation are separated. A variable capacitor 134 includes a planar portion 136 and a stiffener 80. Suspension portions, etc. are not illustrated but may include any embodiment set forth herein. Fixed charge plates 138 may be elevated upon the substrate 140 above an actuator plate 142. Actuator plate 142 is disposed upon a lower substrate 144. The elevation of fixed charge plates 138 may be negligible or omitted to achieve a structure where fixed charge plates 138 and fixed actuator plate 142 are at substantially the same level. For this alternative embodiment, substrates 140 and 144 may be the same level and fashioned from the same material layer in a single process step.

The planar portion 136 of the movable charge plate is affixed to a stiffener 80. Together, planar portion 136 and stiffener 80 are actuated by actuator plate 142 to establish a preferred separation distance 146 for a desired capacitance. Actuator plate 142 uses electromotive force to reposition planar portion 136 of the movable charge plate to a desired separation distance 146.

FIG. 17 illustrates another embodiment of the present invention similar to the embodiment depicted in FIG. 16. A variable capacitor 148 has the addition that there is a plurality of movable charge plates 150 that are isolated from a movable actuator plate 152. According to this embodiment, the establishment of a preferred capacitance may be carried out where the electromotive force applied between the fixed actuator plate 142 and the movable actuator plate 152. This actuation scheme has a diminished effect, if any, upon the capacitance that is established between the fixed charge plate 138 and movable charge plates 150. Accordingly, the desired capacitance established may be more directly related to the separation distance 146.

FIG. 18 illustrates yet another embodiment of the present invention in which the functions of capacitance and electrostatic actuation are separated. A fixed charge plate 154 may be elevated upon the substrate 156 above an actuator plate 158. Actuator plate 158 is disposed upon a lower substrate 160. The elevation of fixed charge plate 154 may be negligible or omitted to achieve a structure where fixed charge plate 154 and fixed actuator plate 158 are at substantially the same level. For this alternative embodiment, substrates 156 and 160 may be the same level and fashioned from the same material layer in a single process.

The planar portion 136 of the movable charge plate is affixed to a stiffener 80. Together, planar portion 136 and stiffener 80 are actuated by actuator plate 158 to establish a preferred separation distance 146 for a desired capacitance. Actuator plate 158 uses electromotive force to reposition planar portion 136 of the movable charge plate to a desired separation distance 146.

FIG. 19 illustrates another embodiment of the present invention similar to the embodiment depicted in FIG. 18, with the addition that the movable charge plate 162 is isolated from movable actuator plates 164. According to this embodiment, the establishment of a preferred capacitance may be carried out where the electromotive force applied between the fixed actuator plate 166 and the movable actuator plate 164. This actuation scheme has a diminished effect, if any, upon the capacitance that is established between the fixed charge plate 168 and movable charge plate 162. Accordingly, the desired capacitance established may be more directly related to the separation distance 146.

In the embodiments set forth in FIGS. 16, 17, 18, and 19, it is understood that suspension of the movable charge plate may be carried out by the suspension portion embodiments as set forth in this disclosure including the interposition of a flexible and/or dielectric structure Additionally, other suspension schemes may be used for this embodiment of the invention.

In the forgoing embodiments, the suspension sections 76, 108, 116, 122, and 126 are examples of a means for suspending the movable charge plate. In the forgoing embodiments, the fixed charge plates 70 and 138 are examples of a means for moving the movable charge plate.

Figure 20:
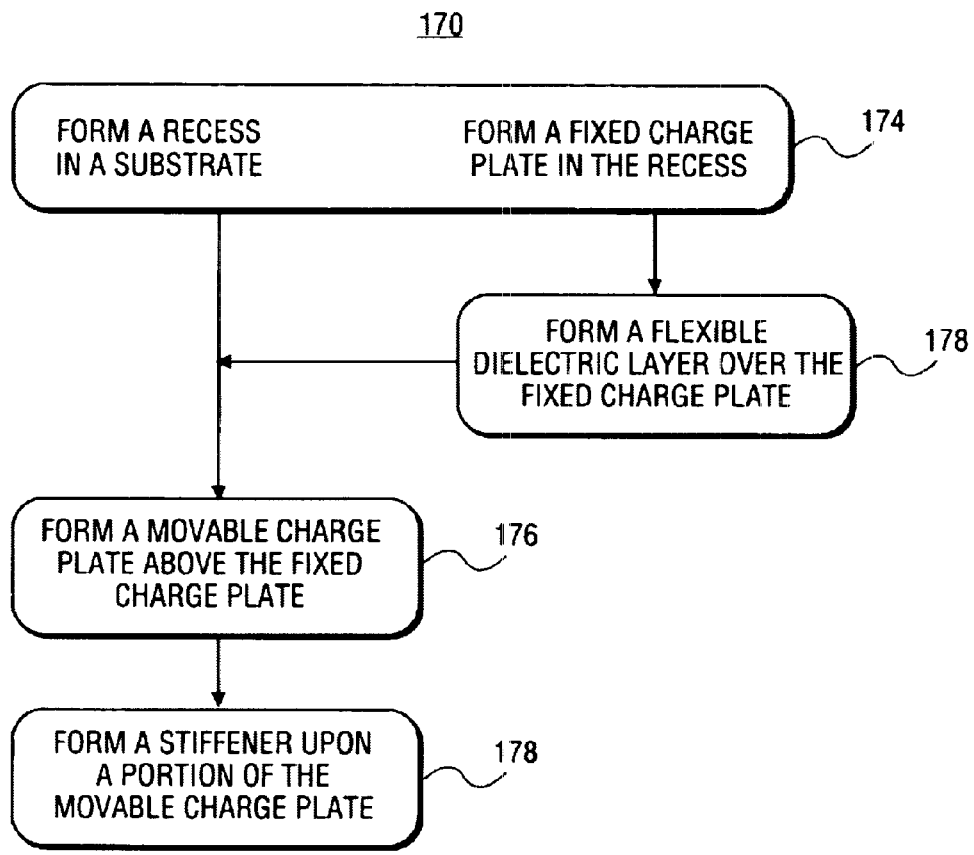
FIG. 20 is a process flow diagram that illustrates the inventive method.

The variable capacitor is made according to an inventive method 170 that is illustrated in FIG. 20. A recess 172 is formed in substrate 68 as depicted in FIG. 9. Recess 172 may be formed of a single etch, or it may be part of a damascene structure. Fixed charge plate 70 is formed in recess 172 by deposition such as chemical vapor deposition (CVD) or physical vapor deposition (PVD). The method illustrated in FIG. 20 demonstrates that formation of the recess and the fixed charge plate may be contemporaneous as depicted in flow block 174. Movable charge plate 72 is formed above fixed charge plate 70 as depicted in process flow block 176. Movable charge plate 72 is formed by a method such as filling recess 172 with a temporary material, depositing movable charge plate 72, and wet etching the temporary filler material that filled recess 172. Stiffener 80 is formed upon a portion of movable charge plate 72 as depicted in flow block 178. Where patterning of at least a portion of movable charge plate 72 precedes removal of filler material in recess 172, patterning of multiple through-holes or any one of the undulating suspension sections as disclosed herein, will facilitate removal of the filler material. According to the inventive method, a flexible dielectric material 102 may be formed 178 over the fixed charge plate.

The variable capacitor 100 illustrated in FIG. 12 is formed in a manner similar to variable capacitor 66. Prior to formation of movable charge plate 104, flexible dielectric layer 102 is formed upon a filler material that is to be removed to form recess 172 as depicted in process flow block 176. After flexible dielectric layer 102 is formed, patterning may precede or follow removal of the filler material disposed in recess 172. Where patterning of flexible dielectric layer 102 precedes removal of the filler material in recess 172, patterning of any one of the undulating suspension sections as disclosed herein, will facilitate removal of the filler material.

The variable capacitor 134 depicted in FIG. 16 is formed by forming lower substrate 144 in recess 172 and forming fixed actuator plate 142 upon lower substrate 144. Elevated substrate 140 is formed either by depositing or etching into a portion of recess 172. Fixed charge plate 138 is formed upon elevated substrate 140 and a filler material to be removed fills recess 172 during the formation of flexible dielectric layer (not pictured) according to embodiments set forth herein. Where fixed charge plate 138 and fixed actuator plate 142 are at the same height, they may be patterned from the same metal layer. Variable capacitor 148 is formed by a similar method with the added limitation that movable charge plates 150 are patterned to form movable actuator plate 152.

The variable capacitor 178 depicted in FIG. 18 is formed by forming lower substrate 160 in recess 172 and forming fixed actuator plate 158 upon lower substrate 160. Elevated substrate 156 is formed either by depositing or etching into a portion of recess 172. Fixed charge plate 154 is formed upon elevated substrate 156 and a filler material to be removed fills recess 172 during the formation of flexible dielectric layer (not pictured) according to embodiments set forth herein. Where fixed charge plate 154 and fixed actuator plate 158 are at the same height, they may be patterned from the same metal layer. Variable capacitor 180 is formed by a similar method with the added limitation that movable charge plate 162 is patterned to form movable actuator plate 164.

Distinct advantages exist for the present invention. One advantage is that a tunable range is achieved that was not achievable in the prior art. Because of the presence of a stiffener as disclosed herein, the critical gap between the movable charge plate and the fixed charge plate can be smaller than what was allowable in the prior art. Consequently, the tunable range of the variable capacitor may be more than 100%. As applied to wireless technology, by way of nonlimiting example, the variable capacitor of the present invention may enable a wireless device to operate at multiple bands such as 900 MHz, 1.9 GHz, and 2.4 GHz. Thus, transceiver design may be changed to enable the same variable capacitor to be used for the various frequencies.

Another advantage is that the establishment and control over a preferred capacitance is more predictable and therefore more reliable. The presence of the stiffener and the broken surface suspension significantly reduces the capacitance that does not change near the terminal ends of variable capacitors of the prior art. Further, the separation of actuation and capacitance as disclosed herein allows for greater control.

In some embodiments of the present invention, an oscillator may be one of a detached or embedded MEMS device that may be integrated into the integrated MEMS package.

Figure 21:
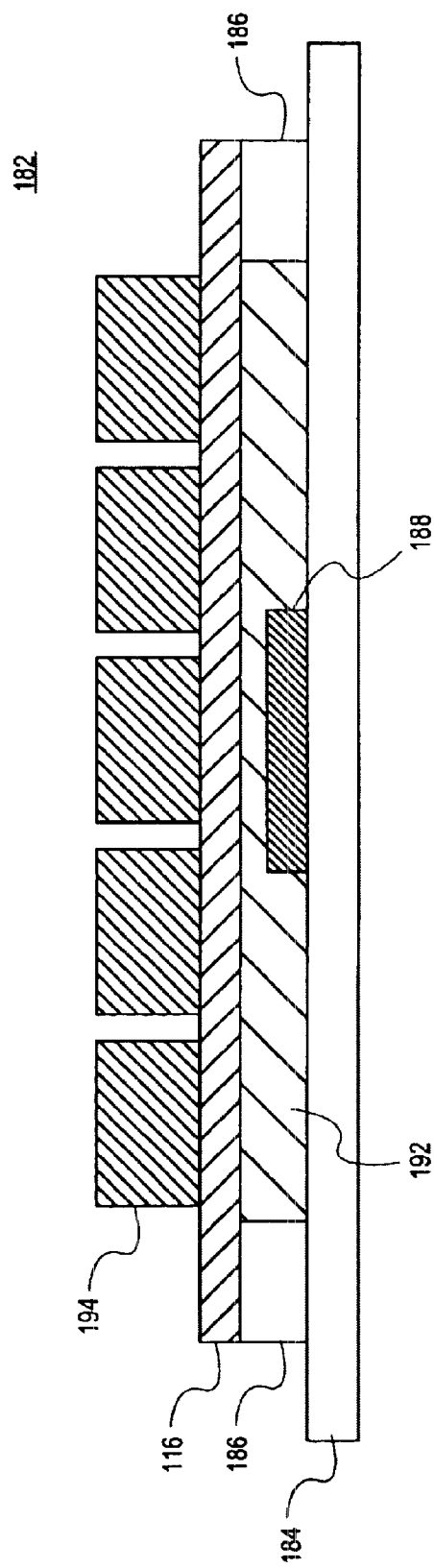
FIG. 21 is an elevational cross-section view that depicts preliminary fabrication of a hollow MEMS resonator beam according to the present invention.

FIG. 21 is an elevational cross-section view that illustrates fabrication of a MEMS resonator 182 according to the present invention. FIG. 21 illustrates a resonator MEMS 182 that includes a substrate 184 upon which the resonator beam is to be situated. A base such as a pedestal 186 has been patterned upon which the resonator beam is to be attached. Upon substrate 184, a drive electrode 188 has been patterned to provide the driving force to the resonator beam.

A first fabrication stage of the resonator beam is the formation of a resonator lower section 190. Resonator lower section 190 may comprise an electrically conductive material. One example of an electrically conductive material is polysilicon, selected from undoped polysilicon and doped polysilicon, either p-doped or n-doped. Another example of an electrically conductive material is a metal such as metals that are typically used in the fabrication of metallization layers. The metal may be selected from aluminum, copper, silver, gold, and the like. The metal may also be selected from titanium, niobium, tantalum, zirconium, hafnium, and the like. The metal may also be selected from tungsten, cobalt, nickel, scandium and others known in the art. Another example of an electrically conductive material is refractory metal nitrides selected from titanium nitride, tungsten nitride, aluminum nitride, and the like.

Resonator lower section 190 is patterned upon pedestal 186 by providing a temporary bulk filler 192 upon substrate 184 abutting between pedestals 16 and upon drive electrode 188 up to the top of pedestal 186. Next, a series of temporary spacer fillers 194 is patterned upon resonator base 18. Temporary bulk filler 192 and temporary spacer fillers 194 are to be removed after further fabrication of the resonator beam. Temporary bulk filler 192 may be removed immediately after formation of resonator lower section 190, but it is preferably removed later in the process.

Figure 22:
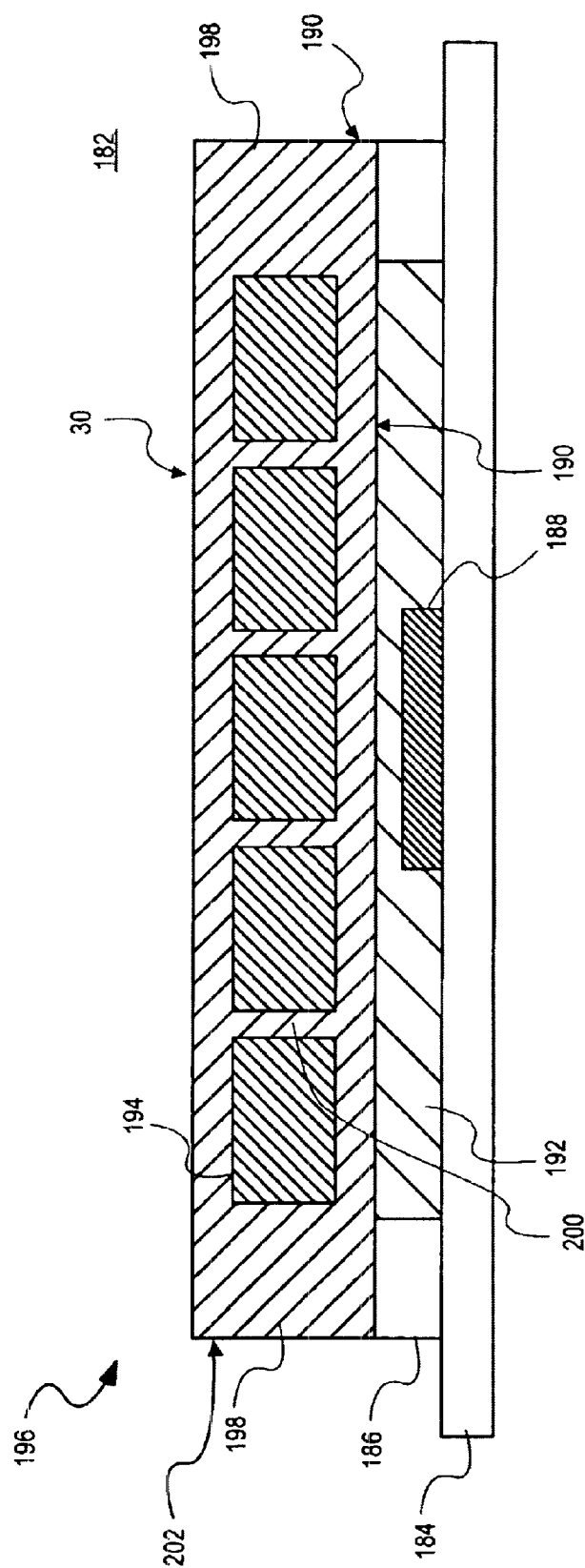
FIG. 22 is an elevational cross-section view of the resonator beam structure depicted in FIG. 21 after further processing to achieve a temporarily filled beam for fabrication purposes.

FIG. 22 is an elevational cross-section view of the resonator beam structure depicted in FIG. 21 after further processing to achieve a temporarily filled beam for fabrication purposes. As depicted, a bridge resonator 196 that has temporary spacer fillers 194 therein has been formed by further deposition of resonator material to include an external wall 198, at least one internal wall 200, and a resonator upper section 202. As a whole, resonator lower section 190, exterior walls 198, internal walls 200, and resonator upper section 202 comprise bridge resonator 196.

After the formation of bridge resonator 196, and preferably before the removal of both the temporary bulk filler 192 and temporary spacer fillers 194, the resonator MEMS 182 may be treated to make the resonator structure an integral unit. Preferably, treatment is a rapid thermal process (RTP) such a heating in an inert environment over a temperature increase range from about 100° C. to about 2,000° C. and for a process time from about 10 seconds to about 5 minutes. In order to provide a microfine-grained, substantially homogenous polysilicon resonator structure that will resist disintegration during field use, it is preferable to use a polysilicon composition that has a grain size in a range from about 0.1 micron to about 10 micron and an aspect ratio from about 1:1 to about 4:1, preferably from about 1.1:1 to about 2:1. Preferably, the polysilicon is doped by implanting doping elements at the borders between individual homogenous phases of the polysilicon. Where bridge resonator 196 is made of a metal, fabrication is preferably carried out by collimated sputtering where the collimator dimensions are about symmetrical to internal wall 200.

Figure 23:
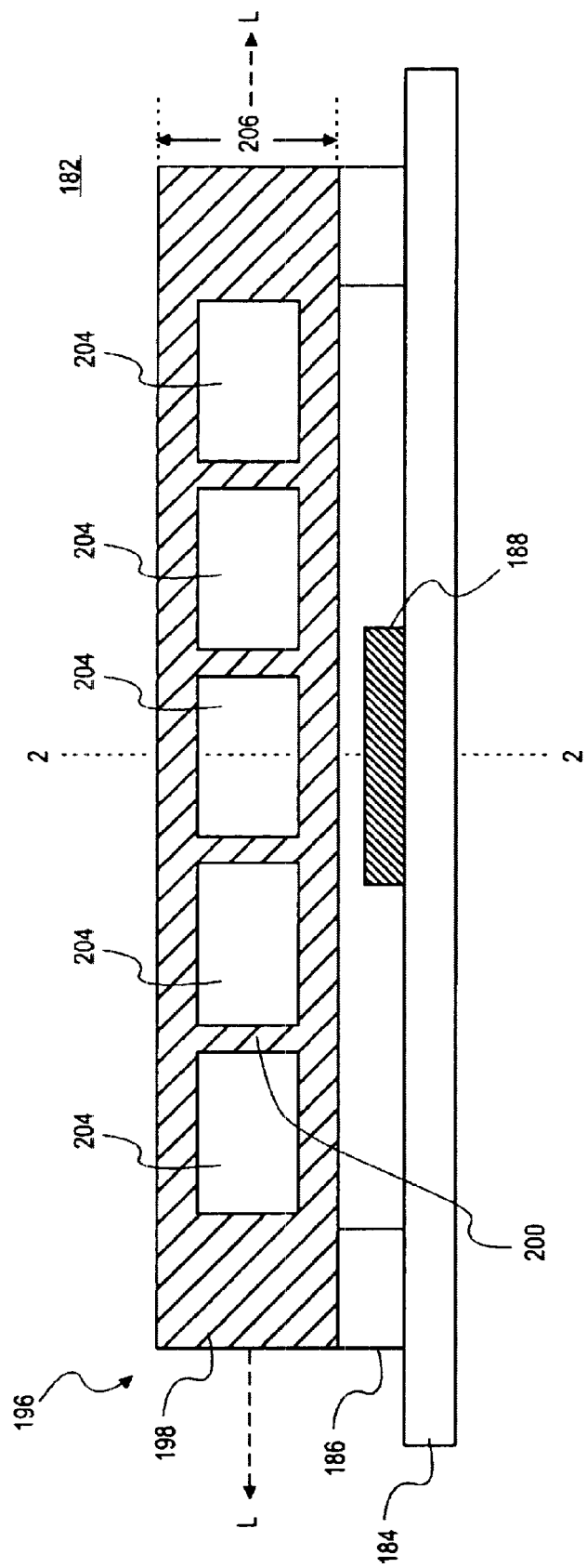
FIG. 23 illustrates further processing of the resonator beam structure depicted in FIG. 22, wherein temporary filler has been removed.

FIG. 23 illustrates resonator MEMS 182 after further processing in which temporary bulk filler 192 and temporary spacer fillers 194 have been removed. The removal process (es) is done by isotropic etching, such as by wet etching. Etch selectivity in the preferable isotropic wet etch(es) is configured to make the etch recipe(s) more selective to substrate 184, drive electrode 188, and pedestal 186, than to temporary filler material(s). The etch recipe selectivity is above about 20:1, preferably below about 100:1, more preferably below about 1000:1, and most preferably below about 5000:1. After the removal process(es), it is observed that bridge resonator 196 is disposed adjacent to drive electrode 188. It is further observed that bridge resonator 196 has a length comprising a longitudinal axis L—L, and wherein drive electrode 188 may be disposed symmetrical to bridge resonator 196 and orthogonal to longitudinal axis L—L.

Figure 24:
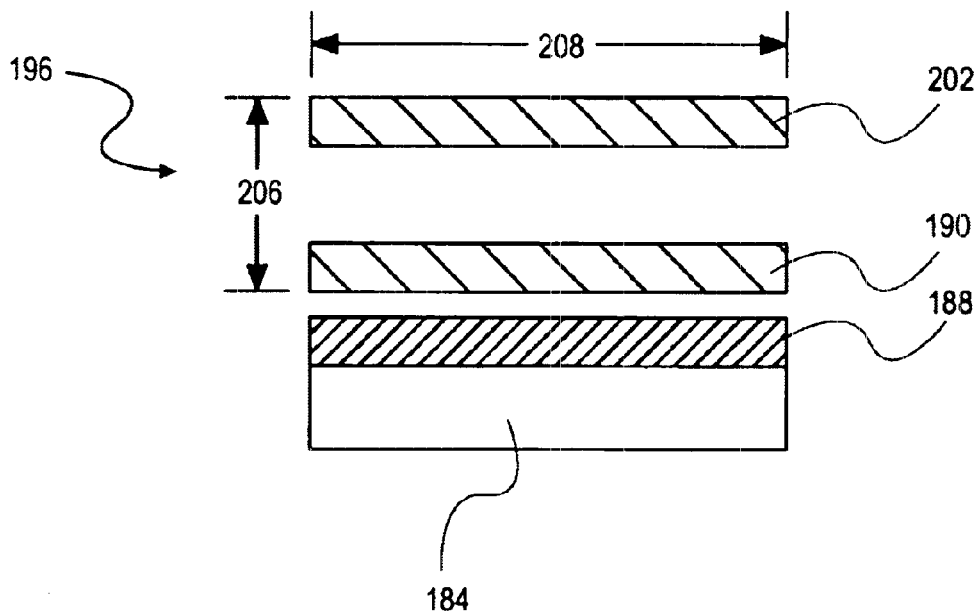
FIG. 24 illustrates alternative processing of the resonator beam structure taken along the section line 2—2 in FIG. 23.

In FIG. 23, bridge resonator 196 has been finished by the removal of temporary bulk and filler spacers that have allowed bridge resonator 196 to form at least one hollow channel 204. Hollow channel 204 lowers the total mass of bridge resonator 196 compared to a solid beam resonator with the same bulk cross-sectional area. FIG. 24 is an elevational cross-section view of resonator MEMS 182 taken along the section line 2—2 from FIG. 23. FIG. 24 illustrates bulk cross-sectional area of bridge resonator 196 as the top-to-bottom thickness 206 thereof, multiplied by the bridge width 208. The resonant frequency can be increased because the amount of mass in bridge resonator 196 is a fraction of the mass of a solid resonator with the same bulk cross-sectional area. The fraction of the mass of a hollow resonator is below about 90% as much mass of a solid resonator with the same bulk cross-sectional area, preferably below about 70%, more preferably below about 50%, and most preferably below about 30%. The resonant frequency of a beam, bridge or a plate/membrane is directly proportional to the square root of the moment of inertia per unit width, and proportional to the inverse of the square root of the mass per unit width. Therefore, an increased specific moment of inertia, I or a decreased specific mass, M, or both, will increase the resonant frequency of resonator 182. Frequency is a function of both resonator stiffness and resonator mass.

According to the present invention, order of magnitude increases in frequency and stiffness can be achieved compared to a solid beam resonator with the same mass where the inventive hollow resonator beam is fabricated. As an example of stiffness increase, a structure like bridge resonator 196 may be considered to have a top-to-bottom thickness 206 of about one half micro meter (micron) thick each for lower and upper sections 190 and 202 respectively, and a channel that is about 2 micron therebetween. This structure will be about 20 times as stiff as a solid resonator with a top-to-bottom thickness 206 of about one micron. Consequently, the resonant frequency, according to equation (1) will be about four and one half times as great for bridge resonator 196. According to the present invention, the hollow beam resonators oscillate in a frequency range that is from about greater than 1-fold to about 10-fold the oscillation of a solid microbeam with an equivalent mass.

FIG. 25 illustrates alternative processing of resonator MEMS 182 taken along the section line 25—25 in FIG. 27. In FIG. 25, etch through-holes 210 are formed to facilitate removal of the temporary fillers 192 and 194. Etch through-holes 210 are preferably formed by anisotropic dry etching. Preferably and alternatively, because resonator lower section 190 may be formed upon temporary bulk filler 192 that covers drive electrode 188 and substrate 184 abutting between pedestals 186, etch through holes 210 may also penetrate temporary bulk filler 192 to any depth down to as far as stopping upon either substrate 184 or upon drive electrode 188. This penetration depth alternative facilitates the removal of temporary bulk filler 192 simultaneously with temporary spacer fillers 194 in a single isotropic wet etch.

FIG. 26 illustrates further processing of resonator MEMS 182 depicted in FIG. 25, wherein the temporary filler materials have been substantially removed. Where the oscillation of bridge resonator 196 may be in part dependent upon the surface area of resonator lower section 190 that is presented immediately adjacent drive electrode 188, the presence of etch through holes 210 in this region may be eliminated.

FIG. 27 is a top view of a bridge resonator 196 wherein etch through holes 210, external walls 198, and internal walls 200 are depicted in phantom lines. Etch through-holes 210 may be configured in any suitable pattern. In FIG. 27 etch through-holes 210 are configured in double column rows on a square pitch, between structures such as external wall 198 and internal wall 200, or between two internal walls 200. Other patterns may be selected according to a specific embodiment including single column, triangular pitch, face-centered cubic, and the like.

During the fabrication of bridge resonator 196, even less mass may be built into the resonator than what is depicted in previous figures. FIG. 28 is a top view of an alternative embodiment of an inventive bridge resonator 214. Etch through-holes 210 are depicted, and the mass of bridge resonator 214 is reduced compared to bridge resonator 196 by the formation of internal posts 216 in lieu of internal walls 200, depicted in FIGS. 22-27. Although internal posts 216 are arrayed in right columns, in FIG. 28 as four columns of six posts each, it is understood that other internal post configurations may be accomplished including non-square pitch configuration as set for above such as the configuration patterns for etch though holes 210.

Figure 29:
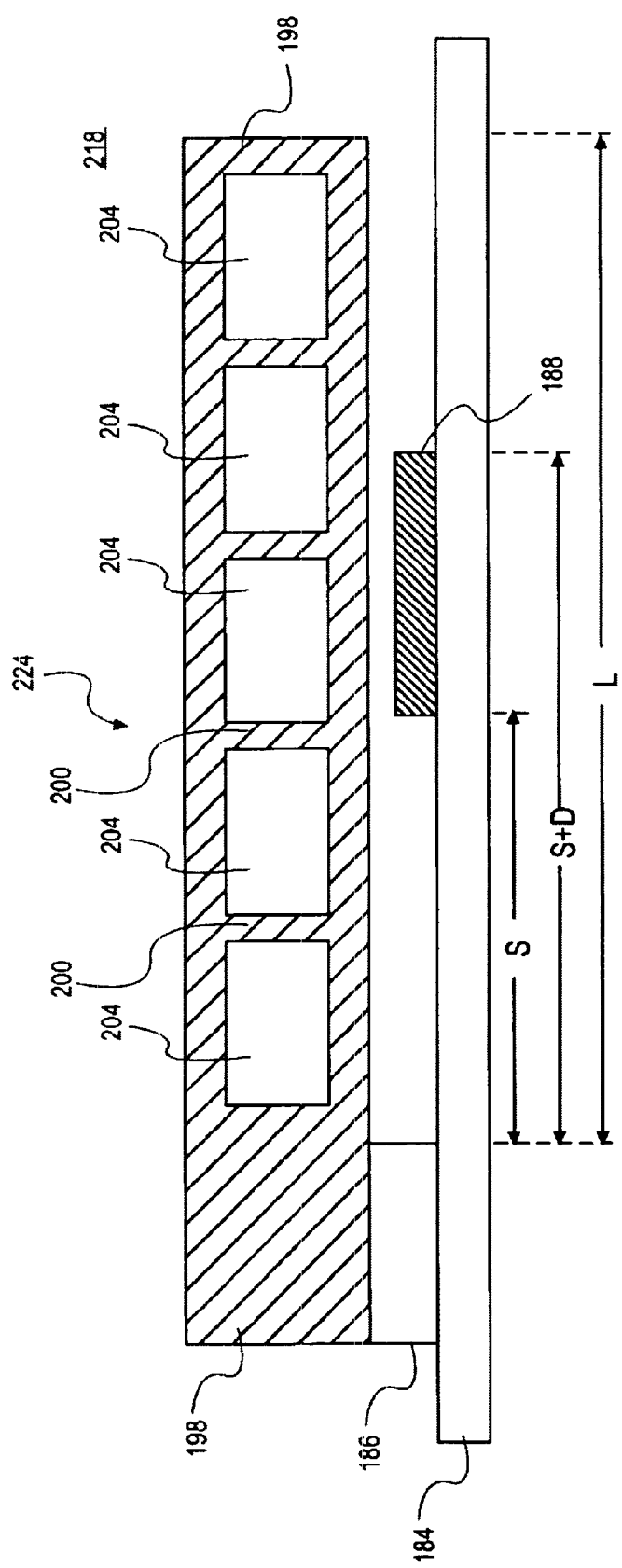
FIG. 29 is an elevational cross-section view of a cantilever resonator beam structure that is another embodiment of the invention.

In some embodiments, a cantilever MEMS 218 may provide resonator qualities that are preferred over a bridge MEMS. FIG. 29 is an elevational cross-section view of a hollow cantilever resonator 220 that is another embodiment of the invention. Cantilever resonator 220 is constructed similarly to bridge resonators 196, 212, and 214 depicted in FIGS. 22–28. Because a hollow cantilever may vibrate differently from a hollow bridge, cantilever resonator 220 may have operational qualities that differ from bridge resonators 196, 212, and 214. Additionally, through-hole processing may be applied to cantilever resonator 220 as set forth herein.

Figure 30:
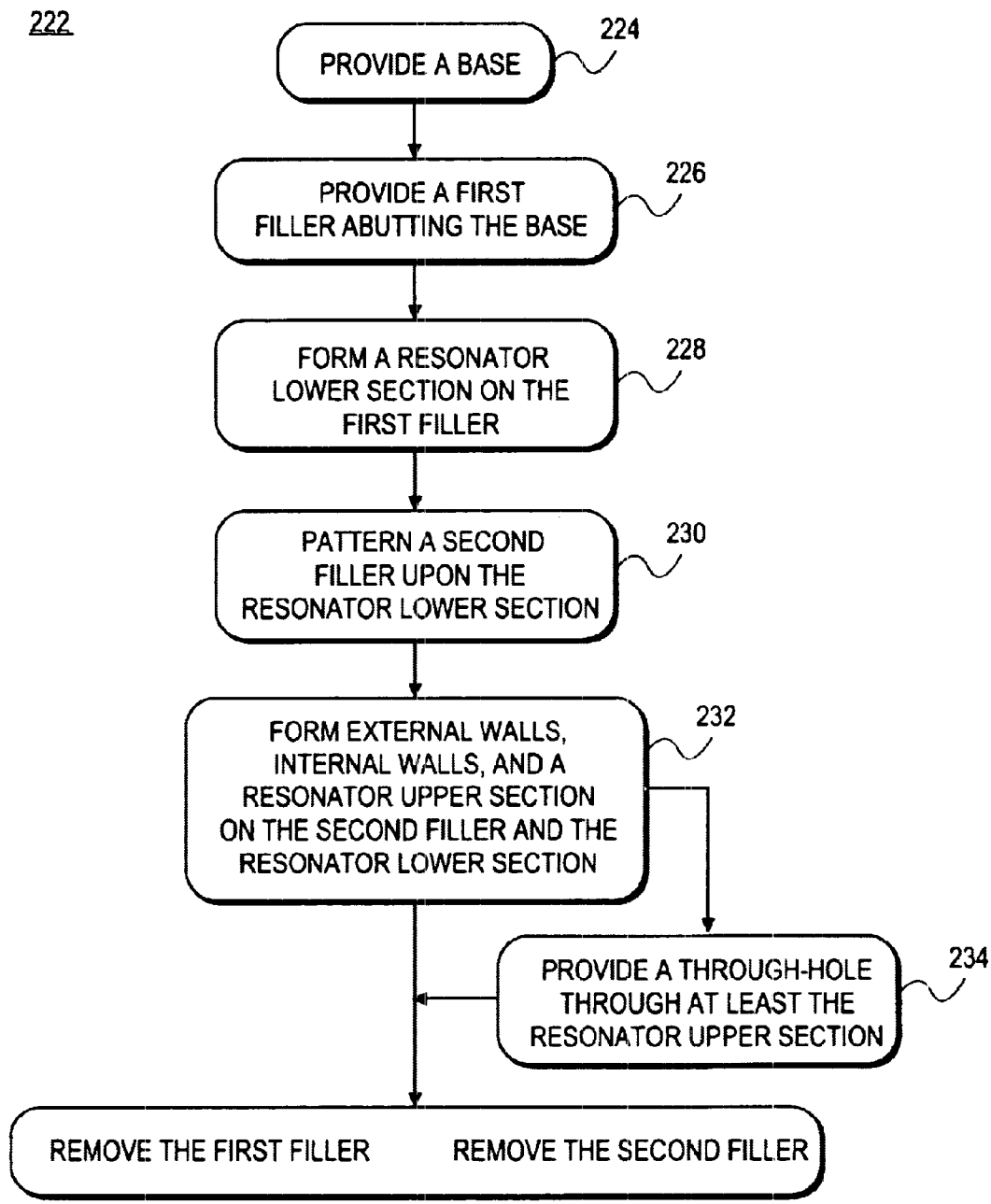
FIG. 30 is a process flow diagram that illustrates one embodiment of the present invention.

The inventive resonator in summary is made according to an inventive method that is illustrated in FIG. 30. The process 222 of making a resonator comprises providing a substrate and a base upon the substrate as depicted in block 224. Where the resonator is to be a bridge, the base comprises two pedestals. Where the resonator is to be a cantilever, the base is one pedestal. A first filler is provided upon the substrate and abutting the base as depicted in block 226. This first filler is typically the temporary bulk filler. A resonator lower section is formed upon the base and the first filler as depicted in block 228. A second filler is patterned upon the resonator lower section in the form of spacers as illustrated in block 230. The remainder of the resonator beam is formed by depositing walls and the resonator upper section as depicted in block 232. Solidification of the resonator beam may be carried out by heat treatment as set forth above. Depending upon the specific materials and processing conditions used for the resonator beam, solidification thereof may be omitted. Removal of filler material may be facilitated by formation of through-holes in the resonator upper section and optionally in the resonator lower section where appropriate as illustrated in block 234. Solidification heat treatment may precede or follow block 234. As illustrated in block 236, fillers are removed. Typically, a drive electrode is formed immediately following or immediately prior to forming a base.

Figure 31:
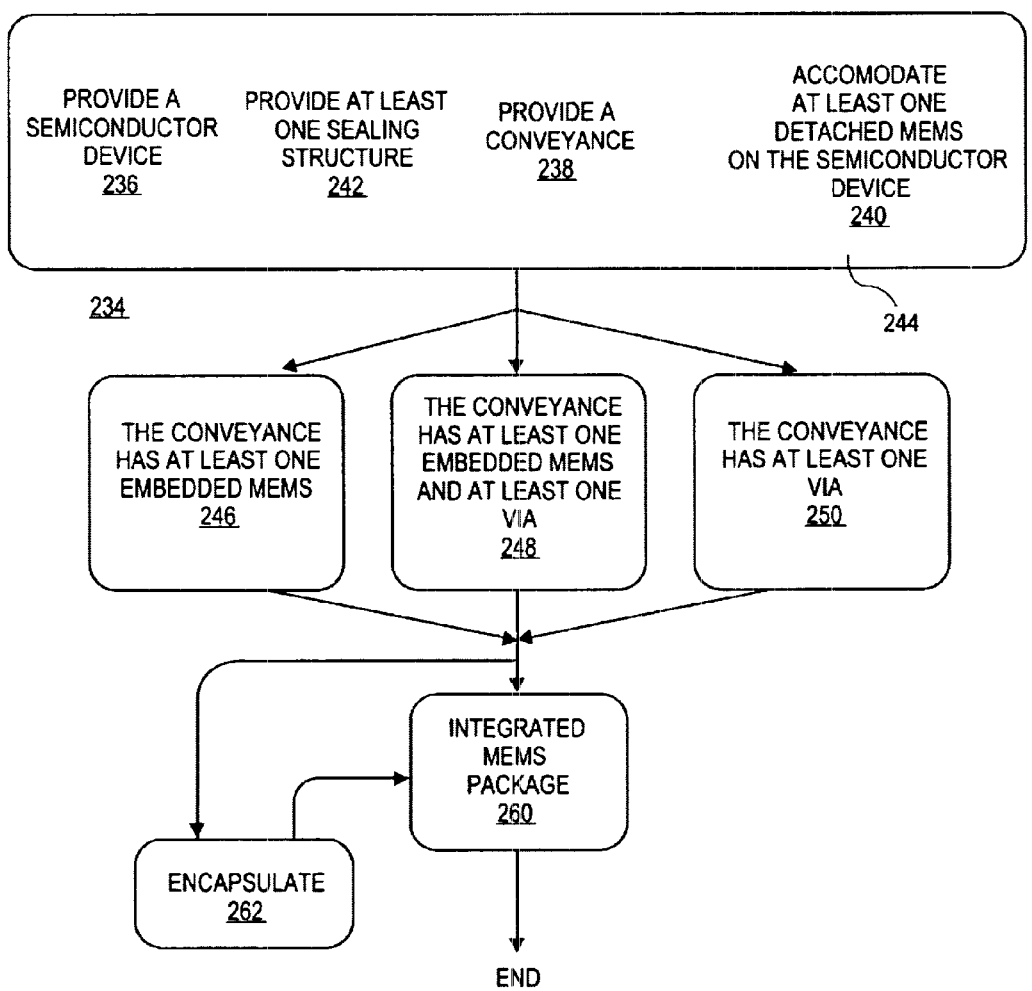
FIG. 31 is a process flow diagram that illustrates one embodiment of the present invention.

FIG. 31 illustrates the inventive process 234 of forming an integrated MEMS package. Process portion 236 illustrates providing a semiconductor device. Additionally, a conveyance is provided 238. Further, at least one detached MEMS may be accommodated 240 on the semiconductor device. For selected MEMS devices, or for all of them, a sealing structure is provided 242. The process choices 244 may be carried out in various combinations. The conveyance may have at least one embedded MEMS according to the present invention 246. Accordingly the at least one embedded MEMS may be TAB affixed 246, or the like, upon the semiconductor device. Alternatively, the conveyance may have no embedded MEMS devices, rather, at least one via through which a detached MEMS will be accommodated 250. Accordingly, the conveyance with at least one via will be TAB affixed, or the like, upon the semiconductor device. Accommodation can be by pick and place techniques, either before, during, or after the placement of the conveyance. Further alternatively, there may be a combination of at least one embedded MEMS and at least one detached MEMS during the inventive process 248. Thereby, a combination of MEMS devices will be set into electrical or optical communication with the semiconductor device. The MEMS device is selected from a switch, a capacitor, an inductor, an oscillator, a power supply, and combinations thereof. According to the present invention, at least one sealing structure is disposed between the semiconductor device and at least one MEMS device that is either embedded or previously detached. The sealing structure is disposed therebetween in a manner sufficient to isolate working parts of the MEMS device(s). Further according to the present invention, an integrated package is formed 260 by the TAB technique or the like, with or without the use of encapsulation 262 as set forth herein.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A micro electromechanical (MEMS) package comprising:
   a semiconductor device;
   a first MEMS disposed in a first structure, and wherein the first MEMS is disposed over the semiconductor device;
   an embedded MEMS in a conveyance that is disposed over the semiconductor device, wherein first MEMS is accommodated in a via in the conveyance.

2. The MEMS package according to claim 1, wherein the first MEMS is selected from a capacitor, a switch, a power supply, and an oscillator.

3. The MEMS package according to claim 1 further comprising:
   encapsulation material disposed over the first MEMS and the conveyance.

4. The MEMS package according to claim 1, wherein the semiconductor device further comprises:
   an active surface;
   a first electrical contact array upon the active surface;
   a second electrical contact array upon the active surface; and
   a sealing structure surrounding the first electrical contact array.

5. The MEMS package according to claim 1, wherein the semiconductor device further comprises:
   an active surface;
   a first electrical contact array upon the active surface;
   a second electrical contact array upon the active surface; and further comprising:
   a sealing structure disposed around the first electrical contact array, wherein the sealing structure comprises a solder ring.

6. The MEMS package according to claim 5, wherein the sealing structure is disposed between the active surface and the first MEMS.

7. The MEMS package according to claim 1, wherein the first MEMS includes at least one variable capacitor.

8. The MEMS package according to claim 1, wherein the first MEMS includes at least one variable capacitor and further comprising:
   at least one third MEMS selected from a switch, a capacitor, a variable capacitor, an oscillator, a power supply, and combinations thereof 9. The MEMS package according to claim 8, wherein the third MEMS is disposed in a third structure that is spaced apart from the first MEMS.

10. The MEMS package according to claim 1, wherein the first MEMS is selected from a bridge oscillator, a cantilever oscillator, and combinations thereof.

11. The MEMS package according to claim 1, wherein the first MEMS is a hollow oscillator.

12. The MEMS package according to claim 1 further comprising:
    encapsulation material disposed over the semiconductor device.

13. The MEMS package according to claim 1, wherein the first structure comprises material selected from monocrystalline silicon, polysilicon, silicon on oxide, and silicon on sapphire.

14. A micro electromechanical structure (MEMS) package comprising:
- a semiconductor device;
- a sealing structure disposed over the semiconductor device;
- at least one detached MEMS in a first structure disposed over the sealing structure, wherein the at least one detached MEMS is selected from a capacitor, a switch, an oscillator, an inductor, a power supply, and combinations thereof;
- at least one embedded MEMS in a conveyance, wherein the at least one embedded MEMS is selected from a capacitor, a switch, an oscillator, an inductor, a power supply, and combinations thereof, and
- encapsulation material disposed over at least one of the conveyance and at least one of the at least one detached MEMS, and the semiconductor device.

15. The MEMS package according to claim 14, wherein the semiconductor device further comprises:
- an active surface;
- a first electrical contact array upon the active surface;
- a second electrical contact array upon the active surface;
- wherein the at least one detached MEMS makes electrical contact with the first electrical contact array, and wherein the at least one embedded MEMS makes electrical contact with the second electrical contact array.

16. The MEMS package according to claim 14, wherein a first of the at least one detached MEMS is a variable capacitor and a second of the at least one detached MEMS is selected from a switch, a capacitor, a variable capacitor, an oscillator, and a power supply.

17. The MEMS package according to claim 14, wherein the at least one detached MEMS is selected from a bridge oscillator, a cantilever oscillator, a hollow bridge oscillator, a hollow cantilever oscillator, and combinations thereof.

18. The MEMS package according to claim 14, wherein the at least one embedded MEMS is selected from a spiral inductor and a helical inductor.

* * * * *